United States Patent
Takeuchi

(10) Patent No.: US 8,984,353 B2
(45) Date of Patent: Mar. 17, 2015

(54) INFORMATION STORAGE DEVICE AND TEST METHOD OF SETTING A TEST CONDITION FOR INFORMATION STORAGE DEVICE OUTSIDE RANGE OF PRESUPPOSED REAL USE CONDITIONS

(75) Inventor: Kiyoshi Takeuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1019 days.

(21) Appl. No.: 13/010,363

(22) Filed: Jan. 20, 2011

(65) Prior Publication Data

US 2011/0179321 A1 Jul. 21, 2011

(30) Foreign Application Priority Data

Jan. 21, 2010 (JP) ................................ 2010-010872
Nov. 11, 2010 (JP) ................................ 2010-252458

(51) Int. Cl.
| | | |
|---|---|---|
| G11C 29/50 | (2006.01) | |
| G11C 29/00 | (2006.01) | |
| G11C 11/41 | (2006.01) | |
| G11C 29/06 | (2006.01) | |
| G11C 29/12 | (2006.01) | |

(52) U.S. Cl.
CPC ................ *G11C 29/50* (2013.01); *G11C 11/41* (2013.01); *G11C 29/06* (2013.01); *G11C 29/12005* (2013.01); *G11C 2029/5004* (2013.01)
USPC ........... 714/718; 714/719; 714/726; 714/763; 714/773; 365/201

(58) Field of Classification Search
None
See application file for complete search history.

(56) References Cited

U.S. PATENT DOCUMENTS

| | | | |
|---|---|---|---|
| 5,309,399 A | 5/1994 | Murotani | |
| 5,377,152 A | 12/1994 | Kushiyama et al. | |
| 5,581,510 A * | 12/1996 | Furusho et al. | ............... 365/201 |
| 8,738,977 B2 * | 5/2014 | Brown et al. | ................. 714/723 |
| 2002/0078405 A1 * | 6/2002 | Tomioka | ......................... 714/42 |
| 2004/0145939 A1 | 7/2004 | Yoshida et al. | |
| 2005/0286308 A1 * | 12/2005 | Nagashima | ............. 365/185.22 |
| 2008/0052015 A1 * | 2/2008 | Ozawa et al. | .................... 702/57 |
| 2008/0181035 A1 * | 7/2008 | Kawasumi | .................... 365/200 |
| 2008/0215939 A1 * | 9/2008 | Ahn et al. | ..................... 714/719 |

FOREIGN PATENT DOCUMENTS

| | | |
|---|---|---|
| JP | 5-120874 A | 5/1993 |
| JP | 5-144296 A | 6/1993 |
| JP | 2002-358795 A | 12/2002 |

OTHER PUBLICATIONS

K. Takeuchi, et al., "Single-Charge-Based Modeling of Transistor Characteristics Fluctuations Based on Statistical Measurement of RTN Amplitude", 2009, Symposium on VLSI Technology Digest of Technical Papers, pp. 54-55.

* cited by examiner

*Primary Examiner* — Justin R Knapp
(74) *Attorney, Agent, or Firm* — Sughrue Mion, PLLC

(57) ABSTRACT

A method of testing the operational margin of an information storage device having marked random variations, and an information storage device having the function of self-diagnosing the operational margin, are provided. The test method includes testing an information storage device including a plurality of memory bits as the test condition is set so as to be outside a range of conditions that may be presupposed in real use of the information storage device and of counting the number of memory bits that fail in operation. The test method also includes verifying the size of the operational margin of the information storage device based on the count value. The test condition is made severe and the reference value is set to a fairly large value to enable the operational margin against the noise to be tested highly accurately.

8 Claims, 24 Drawing Sheets

INFORMATION STORAGE DEVICE AND TEST METHOD OF SETTING A TEST CONDITION FOR INFORMATION STORAGE DEVICE OUTSIDE RANGE OF PRESUPPOSED REAL USE CONDITIONS

TECHNICAL FIELD

Reference to Related Application

This application is based upon and claims the benefit of the priority of Japanese patent applications No. 2010-10872 filed on Jan. 21, 2010 and No. 2010-252458 filed on Nov. 11, 2010, the disclosures of which are incorporated herein in their entirety by reference thereto.

This invention relates to an information storage device and a test method therefor. More particularly it relates to a test method for locating an information storage device that is likely to fail due to noise, and to an information storage device that has such self-test function.

BACKGROUND

As a result of the progress in the miniaturized processing technology, the tendency is more and more towards a large memory capacity of an SRAM (Static Random Access Memory), a DRAM (Dynamic Random Access Memory) and an information storage device exploiting the semiconductor technology, such as a non-volatile memory having a floating gate or a charge capture film. In addition to the SRAM and DRAM, information storage devices of various types, such as MRAM (Magneto-resistive Random Access Memory), PRAM (Phase-change Random Access Memory) or RRAM (Resistance Random Access Memory), are being developed.

Before shipment of semiconductor elements, used for these information storage devices, the semiconductor elements are put to a test to confirm whether or not the products (semiconductor elements) will operate under predetermined conditions. It is only when the results of the test indicate that the products operate normally, the products are sorted as good products and shipped. By so doing, those products manufactured but determined to be rejects are prevented from being shipped.

The above test is usually carried out under an extreme condition within a range of use conditions that may be anticipated from the design specifications, that is, within a range of conditions in which a product in question is to be used. Such an extreme use condition is termed a worst condition or a corner condition. For example, in carrying out the test, the ambient temperature is set at a highest or lowest value anticipated, while the power supply voltage is set at a highest or lowest value anticipated. By so doing, it can be assured that a product shipped will operate normally under an arbitrary use condition comprised within the range of use anticipated.

The test is often carried out at more than two worst conditions, which correspond to different combinations of the temperature and the power supply voltage. This is because there is usually a plurality of failure modes of the information storage devices, such as failures in read out mode or those in write mode and, for these failure modes, failures are most likely to occur in the combinations of different temperatures and power supply voltages. That is, the worst conditions may differ for each of the failure modes.

The above test may be conducted under a condition severer than the worst use condition specified by the design specifications. For example, if the lower limit voltage of the design specifications is 1.0 V, the test may be conducted at 0.9V.

Patent Document 1 discloses an example of such severe test, intended to remove products with only small operational margin to improve the reliability of the shipped products.

Patent Document 3 discloses a test method in which a voltage is applied to a pad of a semiconductor chip to render it difficult to read out data of DRAM cells to detect a memory cell with a small operational margin as a faulty cell.

As for an information storage device, only such a device in which all of the bits operate normally in a test is sorted as being a good product. In some cases, an information storage device has, in addition to the number of the above mentioned memory bits (the nominal number of bits stated in the design specifications), spare superfluous memory bits (redundant bits) in its inside, in which case the number of existing bits is larger than the nominal number of bits. If, in the information storage device, having these redundant memory bits, some of the memory bits have failed, they may be replaced by normal spare bits so that the nominal number of bits as specified in the design specifications will perform normal operations. The product in question may then be shipped as being a good product.

In Patent Document 2, there is disclosed a test method for a non-volatile storage device, having redundant bits, wherein, if the number of faulty bits out of the nominal number of the memory bits is not more than a preset number, the storage device in question is determined to be a good product for the time being, based upon a presupposition that the faulty bits can be rescued by the redundant bits after shipment.

As the size of the semiconductor element is scaled down, variations in device characteristics ascribable to a noise source inside the device increase. As typical of such noise is random telegraph noise (RTN), which pertains to a phenomenon that, with repetition of the process of electrical charges being captured into and released from trap sites in an insulation film of an MOS transistor, the transistor characteristics are varied discontinuously with time. It is stated in Non-Patent Document 1 that, with a semiconductor device exploiting a semiconductor element with a scaled-down size, there is an increasing risk of malfunctions of the semiconductor device ascribable to RTN. As another noise inherent to a semiconductor element, there is known a 1/f noise. It is generally accepted that this 1/f noise and the RTN have a common origin, and that the 1/f noise occurs by superposition of multiple RTNs.

[Patent Document 1] JP Patent Kokai Publication No. JP-A-5-120874, which corresponds to U.S. Pat. No. 5,309,399.

[Patent Document 2] JP Patent Kokai Publication No. JP-P2002-358795A, which corresponds to US Patent Application Publication No. US2004/0145939A1.

[Patent Document 3] JP Patent Kokai Publication No. JP-A-5-144296, which corresponds to U.S. Pat. No. 5,377,152.

[Non-Patent Document 1] K. Takeuchi et al., "Single-Charge-Based Modeling of Transistor Characteristics Fluctuations Based on Statistical Measurement of RTN Amplitude", in Symposium on VLSI Technology, pp. 54-55, 2009.

SUMMARY

The entire disclosures of Patent Documents 1 to 3 and Non-Patent Document 1 are incorporated herein by reference thereto.

The following analysis is given by the present invention. As the size of a transistor or other elements, used in an information storage device, is scaled down, the risk that the noise emanating from a noise source inside a device, such as RTN, produces malfunctions of the information storage device increases. An effective measure to reduce the probability of occurrences of such malfunctions is that an information storage device shipped has sufficient operational margin.

With the conventional test method, it may be ascertained that, at a certain time at which the test is executed, a product tested can perform normal operations even under a worst condition. It is however not possible to decipher if the device tested has operated as normally because the device has had a sufficient operational margin, or if the device has had only poor operational margin but has barely passed the test, viz., no noise such as RTN happened to occur. Stated differently, with the conventional test method, it is not possible to decipher whether or not a product under test has sufficient operational margin. Therefore, there is a risk that such a product that barely passed the test is shipped and fail in operation after the shipment.

If the method of testing under a condition severer than the worst condition as stated in the design specifications, disclosed in Patent Document 1 or 3, the probability that a product with only small operation margin is removed as a reject is enhanced. However, with this method, there is also a problem that a product with a small operation margin can not be completely removed. There is a further problem that a product with a sufficient operational margin, which should be treated as a good product, may be wastefully discarded as a reject. These effects of the conventional severer test, which may not be understood intuitively with ease, will be clarified by statistical calculations. Explanation will be made later in connection with Examples. There is another problem that the noise produced from a noise source inherent to a transistor, such as RTN, is produced at random. Hence, its effect may not be avoided during testing. If a severe test is conducted, and the noise happened to occur during the test, such a problem may be raised that a product having operational margin is determined to be a reject.

In Patent Document 2, there is disclosed a method of efficiently executing a test of a non-volatile storage device based on presupposed relief by redundant bits. However, the test disclosed is a test in an intermediate process that relies on the presupposed relief in later processes, while a method for sorting a product with sufficient operational margin is not disclosed.

In a first aspect of the present invention, there is provided a method of testing an information storage device including a plurality of memory bits. The method includes performing a test on the information storage device setting a test condition outside a presupposed range of real use conditions, and counting the number of those of the memory bits that fail in operation. The method also includes determining the size of an operational margin of the information storage device from the count value of the faulty bits.

In a second aspect of the present invention, there is provided an information storage device including a memory cell array, and a built-in self-test unit that executes a self-test of the memory cell array, which counts the number of memory bits that fail in operation while automatically renewing the address of said memory cell array, and output the result of the counting to outside.

In a third aspect of the present invention, there is provided a memory tester that tests an information storage device including a plurality of memory bits. The memory tester includes a controller unit, a reference value memory unit, a test execution unit and a faulty bit counting unit. The controller unit writes in the reference value memory a reference value of faulty bits, which is to be a reference of a pass/fail decision of an information storage device under test. The reference value of faulty bits is at least one. The test execution unit tests the information storage device under a test condition outside a presupposed range of real use conditions preset by the controller. The faulty bit counting unit counts the number of faulty bits in the information storage device, as detected during execution of the test by the test execution unit. The faulty bit counting unit decides that the information storage device has failed in case the count value has exceeded the reference value stored in the information storage device.

The meritorious effects of the present invention are summarized as follows.

In the test method of the present invention, it may be checked whether or not a given information storage device has a sufficient operational margin. In this manner, such products that are high in reliability against noise may be selected and shipped. In addition, such an information storage device in which the number of faulty bits is not zero but the number is not larger than a reference value is determined to be passable. Thus, even when the noise happened to occur during testing, a product having a sufficient operational margin is not determined to be not passable through error, so that products of high reliability may be shipped at a reduced cost.

In the memory tester according to the present invention, the above test method may be executed easily.

In the information storage device according to the present invention, the above test method may be executed as a self-test.

BRIEF DESCRIPTIONS OF THE DRAWINGS

PREFERRED MODES

Before proceeding to more concrete description of each Example of the present invention, the operating principle of the present invention will be described with reference to the drawings.

Figure 1:
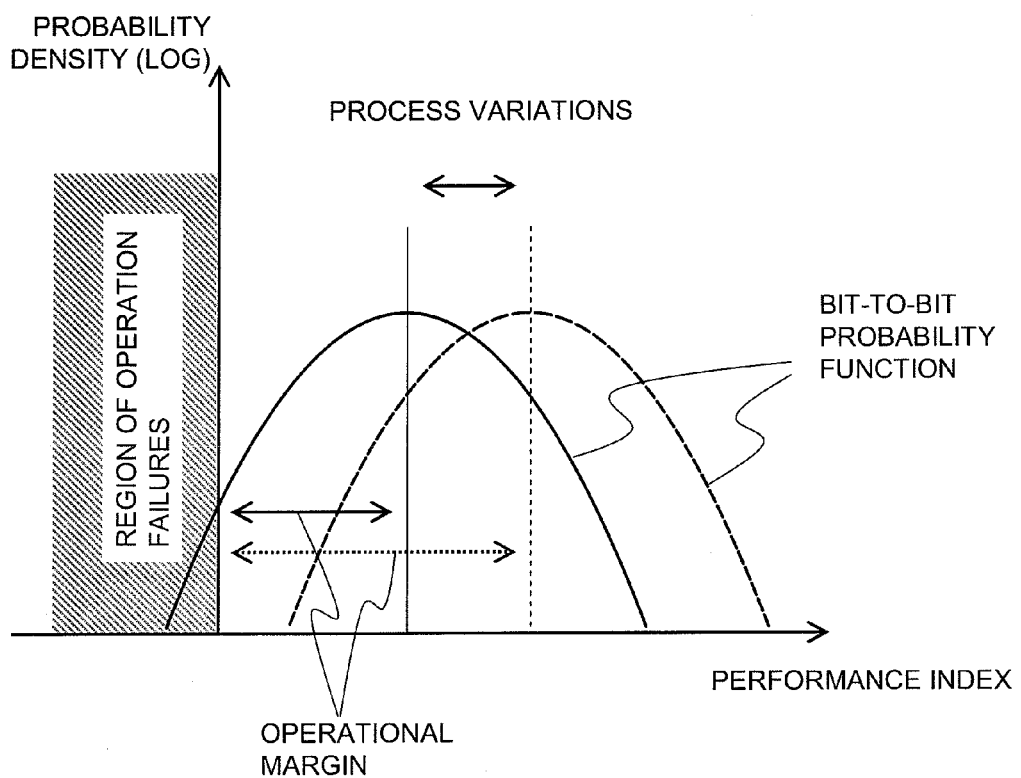
FIG. 1 is a graph for illustrating the principle of the present invention.

An information storage device usually includes a very large number, for example, one million number, of memory bits. In general, the characteristic of each memory bit is not constant, but has a statistical distribution due to manufacturing tolerances. FIG. 1 schematically shows such state. Referring to FIG. 1, performance index represents a certain index relevant to whether or not a memory bit performs a normal operation.

Figure 2:
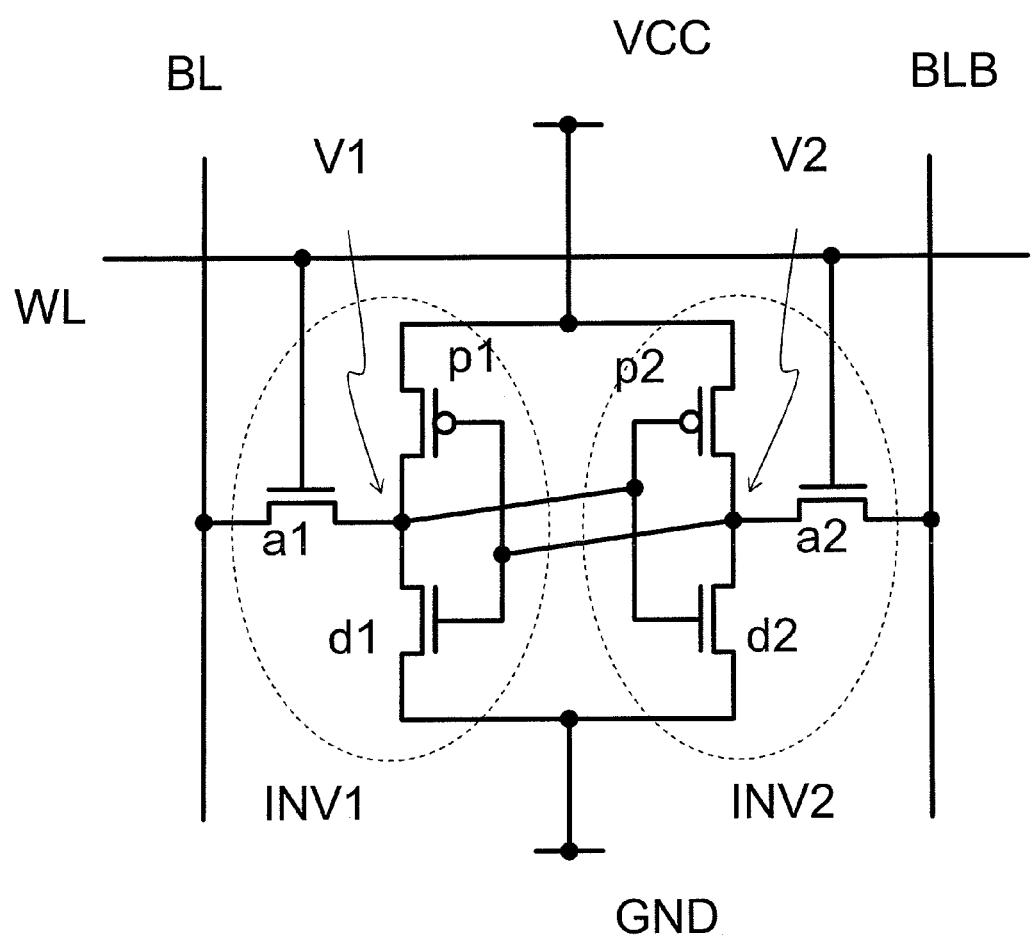
FIG. 2 is a circuit diagram for illustrating the configuration of an SRAM memory cell as an example object of application of the present invention.
Figure 3:
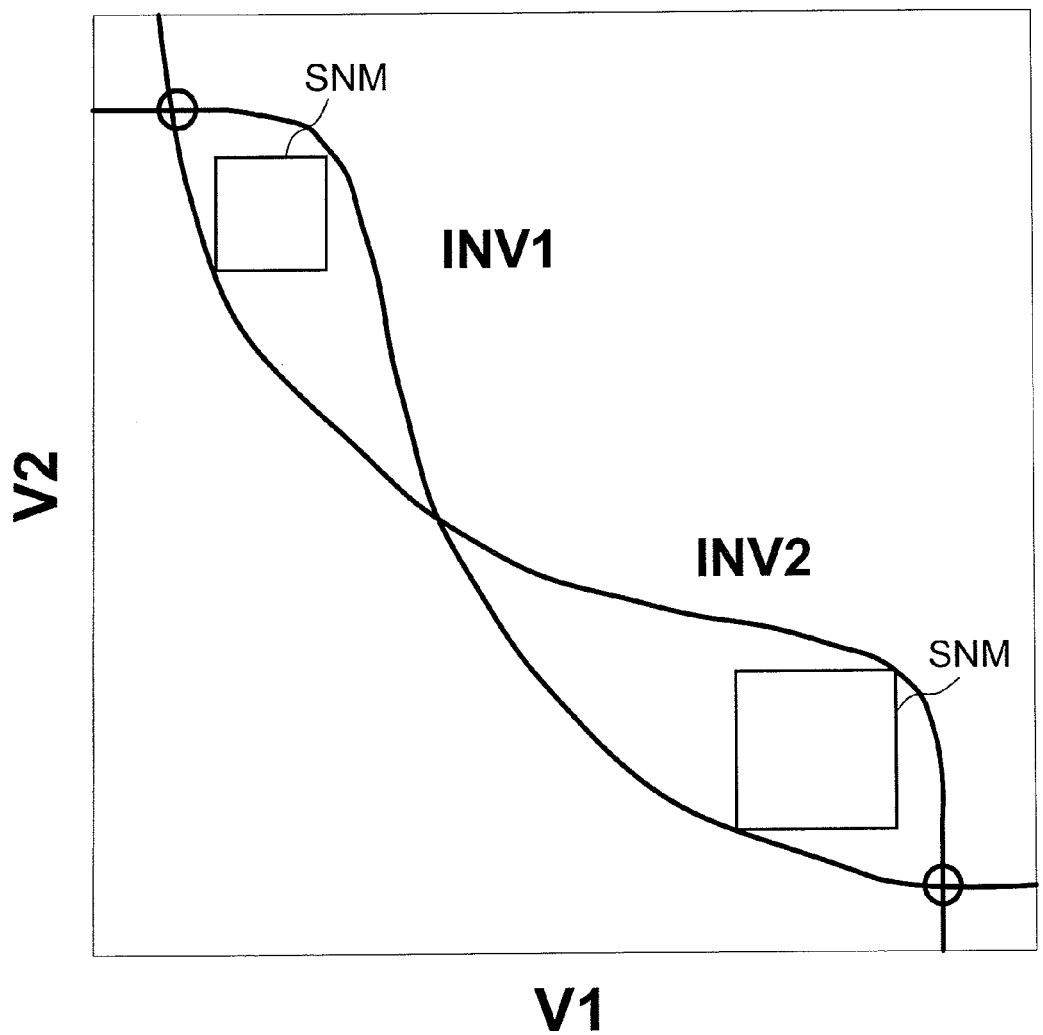
FIG. 3 is a graph for illustrating the static noise margin (SNM) in an SRAM.

As typical of this index is an SNM (Statistic Noise Margin) in an SRAM (Static Random Access Memory). A memory cell of the SRAM is usually made up of four N-channel transistors (a1, d1, a2, d2) and two P-channel transistors (p1, p2), as shown in FIG. 2. In reading out the information from this SRAM cell, the potential on a word line WL is raised to turn on the transistors a1 and a2 to read out the potentials at internal nodes V1, V2 via bit lines BL and BLB. In this state, the transistors a1, d1 and p1 form an inverter INV1, whilst the transistors a2, d2 and p2 form an inverter INV2. FIG. 3 shows transfer characteristics of the inverters INV1, INV2 superposed together in one drawing sheet. If there are two areas surrounded by the two transmission characteristics, as shown in FIG. 3, there are two stable points shown encircled in FIG. 3 in readout. If such is the case, this SRAM is able to store two data of 0 and 1 in stability, and hence is able to perform a normal readout operation. The length of one side of a square inscribing each of the two surrounded areas is defined as SNM. The characteristics of the transistors are varied statistically, as a result of which the transfer characteristics of the inverters INV1, INV2 are varied so that the size of the SNM is also varied. If the SNM exceeds zero, the SRAM cell may be read out in stability. If otherwise, one of the stable points is erased, such that data of 0 or 1 is erased at readout time.

The variations in the performance variations are made up of process variations and random variations. The process variations are variations from one chip to another. The chip carries an information storage device printed thereon. The random variations are variations from one bit in the chip to another. The process variations are differences in the finish of a chip caused by changes of the states of the apparatus used for manufacturing the chip with time, by fluctuations in the gas flow rate or temperature in the apparatus or by changes in the position of the chip on a wafer. The random variations are mainly ascribable to microscopic variations in the inside of the transistors that make up the memory bit and inter alia to discreteness of an impurity dopant. A large number of chips, formed on a wafer, are sliced to individual products.

There are two SNM values for one SRAM, as shown in FIG. 3. One of the two values corresponds to stability of '0' storage, while the other corresponds to stability of '1' storage. It is known that, if attention is focused on one of the two SNM values, the value approximately exhibits normal distribution. The average value of the normal distribution is varied from chip to chip due to process variations. The SNM is distributed with a spread on either sides of an average value as center in a chip. The standard deviation of this spread, that is, the random variations, is labeled $\sigma$. It is known that, in many cases, the variation of $\sigma$ from chip to chip is small. The present invention may apply even though $\sigma$ varies from chip to chip. However, in the following description, an assumption is made that, if not otherwise stated, the value of $\sigma$ is constant without dependency on the chips, for ease of explanation. An assumption is also made that the performance index is SNM corresponding to storage of 0 or to storage of 1.

An average value of SNM of each chip is varied depending on the process variations, as a result of which the distance between the average value and the boundary of the region of failures in the operation, that is, an operational margin of FIG. 1, is varied. As regards the SNM, SNM=0 stands for the boundary of the region of failures in the operation, and an average value of SNM is the very operational margin. The smaller the operational margin is, the higher becomes the probability that a given bit is a faulty bit (the probability that SNM<0), and simultaneously, the higher becomes the probability that, for a certain bit, SNM>0, but SNM is close to zero, as will be understood from FIG. 1. For a bit with SNM larger than, but extremely close to 0, the probability of bit failure due to noise is high.

Suppose that a test is conducted in connection with the performance index, with the boundary to the region of the faulty operation of FIG. 1 as a reference to verify pass/not passable. A chip having a bit such that SNM<0 is detected because a malfunction occurs, and may thus be removed. However, such a bit where SNM>0 but SNM is extremely close to 0 may not be detected by this test unless the noise happens to occur during the test. Hence, such bit is shipped as being a good product. Viz., such bit that is highly susceptible to a malfunction by the noise (risky bit) is shipped as being a good product.

Figure 4:
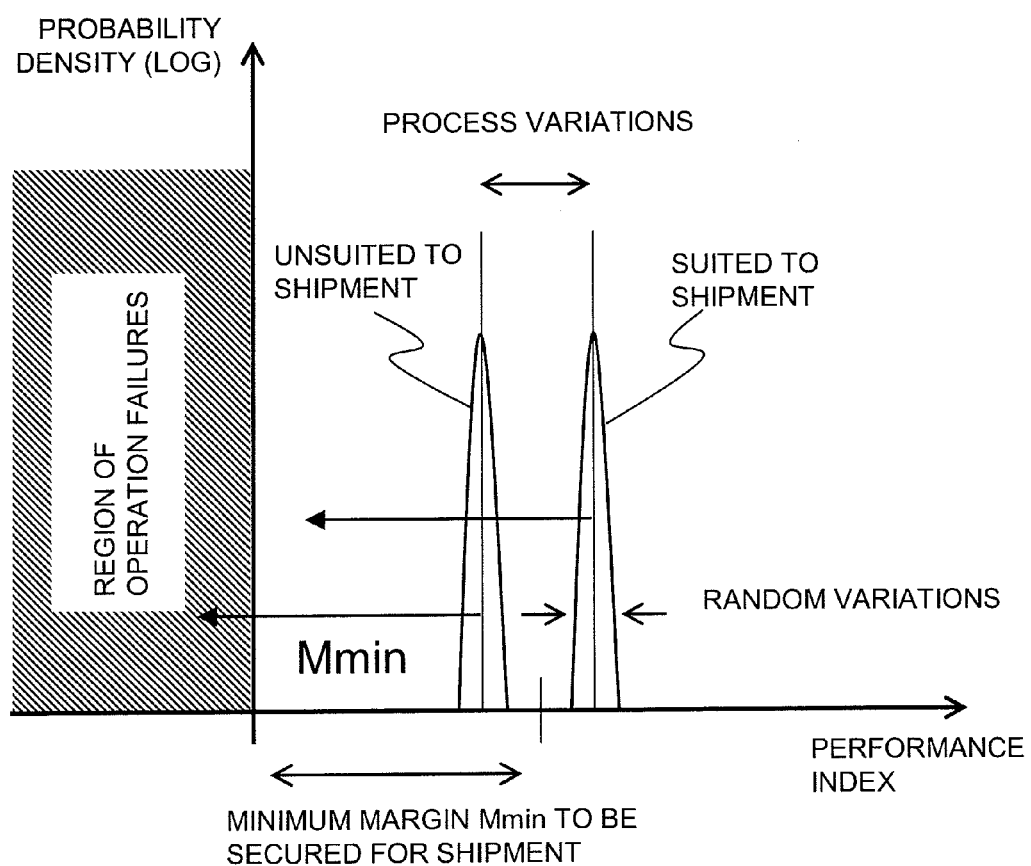
FIG. 4 is a schematic view showing the relationship between the variations and the operational margin in a conventional information storage device.
Figure 5:
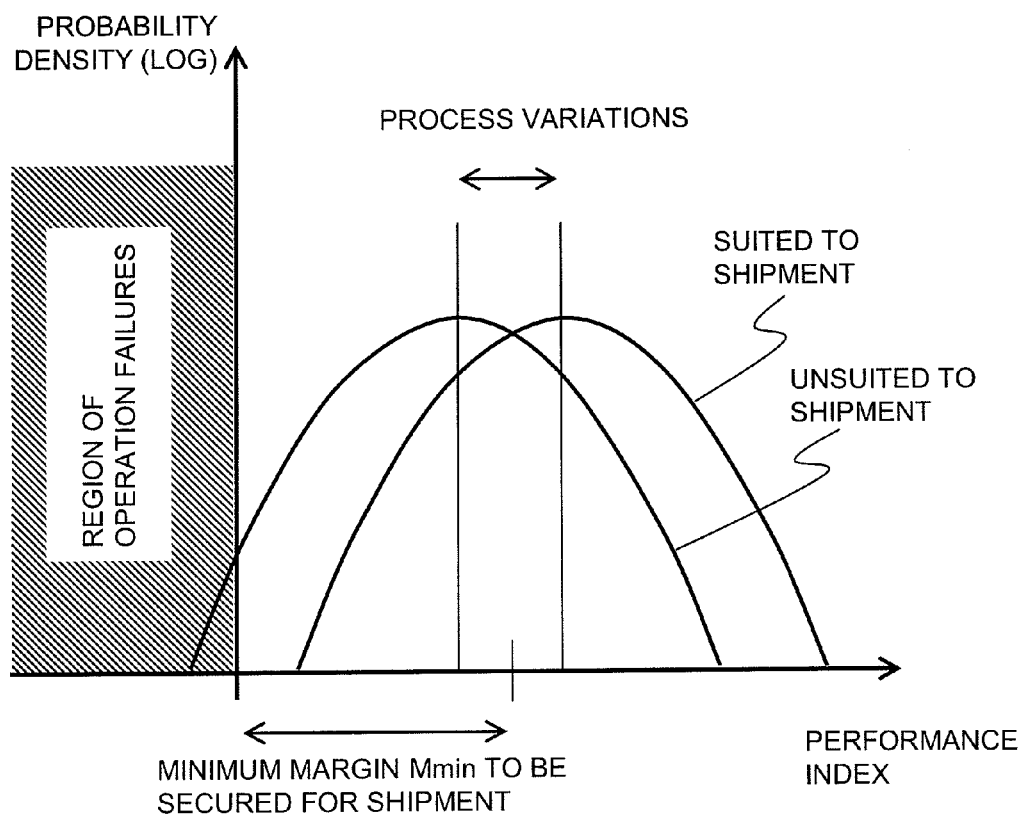
FIG. 5 is a schematic view showing the relationship between the variations and the operational margin in a more recent information storage device.

FIGS. 4 and 5 show the relationship of the variations and the operational margin for a conventional information storage device and a most recent information storage device with a scaled down size, respectively. With the conventional information storage device that has not been scaled down in size to any marked extent, minute sized variations, inter alia the effects of discreteness of an impurity dopant, in the inside of a transistor, are only small, with the ratio of the random variations to the process variations being sufficiently small. Thus, if a test is conducted under a severe condition selected so that the performance index is decreased by the minimum operational margin Mmin that should be secured at the time of shipment, as shown in FIG. 4, all of the information storage devices with a margin larger than Mmin will pass, and those with a margin smaller than Mmin will fail. The severe test, stated in Patent Documents 1 and 3, is based on this notion.

On the other hand, with the production process of the most recent information storage device with the severe scaling down in the manufacturing process, the effect of minute sized variations in the inside of a transistor that forms a memory bit, in particular the discreteness of impurity dopants, has become non-negligible. In general, process variations may be suppressed to within a certain range by raising the precision of manufacturing equipment or bettering the management of the manufacturing process. However, the random variations are innate to the transistor of the memory bit, such that it is difficult to suppress the magnitude of the random variations. In a miniaturized information storage device, the random variations are increased, whilst the operational voltage is lowered, as a result of which the designing with sufficient margin as shown in FIG. 4 is becoming more difficult. Hence, an information storage device must be designed and used in a situation where the statistical distribution function of the random variations approaches the region of operation failures, as shown in FIG. 5. Under such a situation, a need arises for such a test method by which it is possible to determine whether or not desired Mmin has been assured adequately and accurately.

If, in case of marked random variations, as in FIG. 5, a test severer by Mmin is carried out, as in FIG. 4, the probability density function intrudes appreciably into the region of the failed operation. In this case, many of information storage devices allowable for shipment are determined not to pass the test, due to excessively severe test conditions, thus lowering the yield. Hence, it may not be said to be realistic to conduct a test based on the same notion as that of FIG. 4 in case the random variations are significant as in FIG. 5. For this reason, the severe test, such as that shown in Patent Documents 1 and 3, is carried out from time to time under the condition in which the width of reduction of the operational margin is relaxed appreciably. For example, granting that Mmin of approximately 6σ in the least is desirable, such test severer by 0.5 to 1σ may be carried out instead of a test severer than 6σ. However, if, with such relaxed test, the process variations occur in the direction of less operational margin, such a chip containing many of risky bits close to SNM=0 in terms of probability may pass a test. If a chip contains many risky bits in terms of the probability, the result is that a chip liable to malfunctions due to noise and hence not allowable for shipment is shipped as a product.

To prevent such risky bit from being shipped, the operational margin should be set to a sufficiently large value, such as 6σ or more. By so doing, the tail of the statistical distribution of the random variations is pulled out of the region of the failed operation to suppress the probability of shipment of risky bits to a practically negligible value. According to the present invention, it is possible to determine whether or not the operational margin surpasses a preset value. By selecting only those chips whose operational margin surpasses a preset value, according to the present invention, it is possible to prevent shipment of a product containing risky bits to improve product reliability.

Comparison between the probability distribution in FIG. 5 of products allowed for shipment with large random variations, with the probability distribution in FIG. 4 of products allowed for shipment with small random variations, indicates that, in terms of the probability distribution, more products low in operational margin are contained in the products allowed for shipment of FIG. 5. This reflects the situation that the miniaturized information storage devices are in need of designing with less operational margin than conventional products. For this very reason, such a test with which it is possible to grasp the operational margin accurately is needed. It should be noted that, if the operational margin available is too small, system-oriented measures, such as ECC (Error Correction Code) may be used, depending on the particular situation. However, even if such a measure is adopted, under a situation in which the magnitude of the random variations is significantly larger than that of the process variations, a test method is necessary which can tell whether or not the process variations are in the state allowable for shipment.

Figure 6:
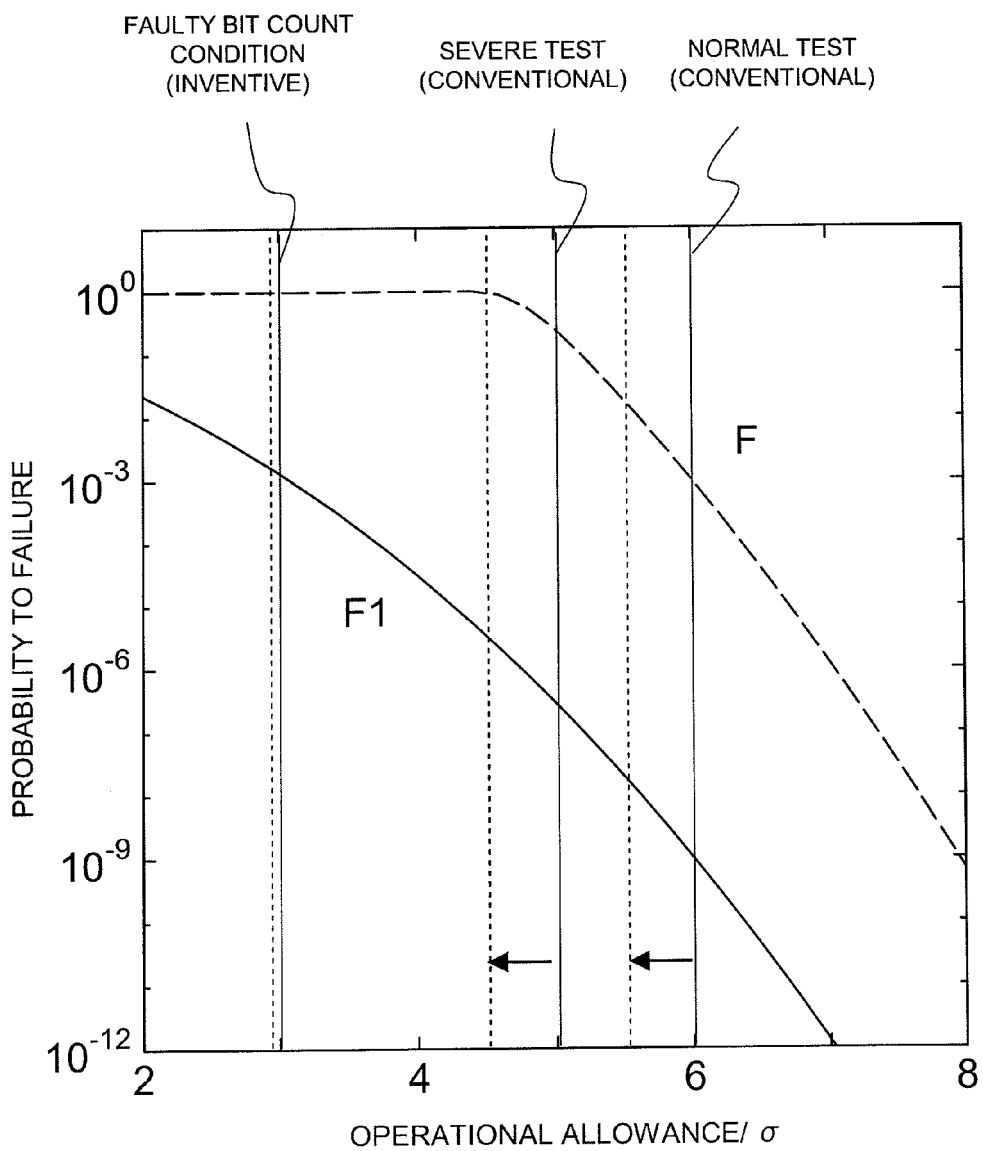
FIG. 6 is a graph for illustrating the principle of the present invention.

The principle of the present invention will now be described in comparison with the conventional test method. The graph of FIG. 6 shows a probability F1 (solid-line curve) that each bit fails and a probability F (broken-line curve) that a chip fails in its entirety, that is, that at least one bit in a chip fails, against the operational margin normalized by σ. It is assumed that no redundant bits are used, and the performance index SNM is normally distributed. F1 and F can be expressed as functions of the probability density function of SNM (normal distribution) P(x) and the total number of the bits N, as the following equation (1):

[Equation 1]

$$F_1 = \int_{x=-\infty}^{0} P(x)dx, \ 1 - F = (1 - F_1)^N \quad (1)$$

The value of the operational margin necessary for sufficiently suppressing the probability of shipping risky bits is determined depending on the magnitude of the noise in the transistors used and design requirements as regards to which extent the occurrence of failures is to be tolerated. In the following explanation, it is assumed that an operational margin of 6σ is needed under the worst condition. In this case, a product should be designed so that, if process variations are within a presupposed range, the operational margin under the worst condition will not be below 6σ. It is assumed that designing has actually been done in this manner. Under such presupposition, if the process variations are within the presupposed range at all times, there should be no noise-related problem. However, non-ideal situation may occur from time to time where the process variations accidentally deviate from the presupposed range. It is therefore desirable that the occurrence of such state outside the presupposition may be detected by a test to prevent shipment of a product including a risky bit.

In the following, a conventional normal test, a conventional test under a severe condition and a test according to the present invention will be described. It should be noted that, in FIG. 6, solid vertical lines stand for operational margins under a presupposed worst condition in each test method, while broken vertical lines stand for operational margin decreased to outside the presupposed range in each test method.

The conventional test is carried out under the worst condition from among the combinations of the temperatures and power supply voltages that may be presupposed in real use. If the operational margin under such a worst condition happens to be 6σ, the lowest presupposed value, the yield of the chip is calculated from the equation (1) to be 99.9%, if the total number of bits is 1 Mbit (hereinafter assumed the same). In this case, the yield is sufficiently high and, moreover, there is no noise-related problem. However, problems may occur in case the process has varied to outside a presupposed range. Suppose that, in a certain chip, the design margin under the worst condition has further decreased by 0.5σ to 5.5σ. In this case, the yield of the chip is calculated from the equation (1) to be 98%. Viz., this chip is decided by the test to be a good product with a probability of 98% in the test. Thus, with the conventional test method, if the process has varied to outside the presupposed range, there is a risk that almost all of the chips whose operational margin is below 6σ are shipped.

To prevent a chip with only small operational margin from being shipped, there has been known a method of conducting a test under a temperature and a power supply voltage severer than the worst condition that may be presupposed in real use (see for example Patent Document 1). In this conventional severe test method, a test is conducted under the conditions of the temperature and the power supply voltage such that the operational margin is below 6σ, such as 5σ, when the process is in the presupposed worst state (state of the smallest operational margin). In this case, the yield of a worst presupposed chip is calculated from the equation (1) to be 75%. Viz., since the test conducted is severe, the number of the chips regarded as good products is decreased with a certain loss (cost of discarding is 25% in the present case). Then, suppose that the process has undergone variations beyond presupposition such that the design margin has further decreased by 0.5σ. In this case, the operational margin during the test has decreased to 4.5σ and the yield F of the chip is calculated to be 3%. Thus, 97% of the chip whose design margin has decreased by 0.5σ below the allowable value can be removed as rejects, and hence may be exempted from shipment. Viz., the conventional severe test may be said to possess certain advantages. However, the remaining 3% is shipped. Stated differently, the products with the design margin of only 5.5σ under the worst condition are shipped, although in a smaller proportion. Moreover, 25% of the products having the operational margin of 6σ under the worst condition and which should have been held to be good products are discarded, thus increasing the production cost on the whole.

In the test method according to the present invention, a test is conducted under the conditions of the temperature and the power supply voltage such that, when the process state is the worst state that may be presupposed (state where the operational margin is minimum), the operational margin is e.g., 3σ. The extremely severe test condition used in the present invention, viz., the test condition in which the probability of occurrence of faulty bits is raised, or in which the operational margin is reduced, is referred to below as the 'faulty bit count condition'. Under the faulty bit count condition, the probability that a chip in its entirety is fully functional is about equal to zero, and hence the information on whether or not a chip in its entirety is functional or not has no meaning. Instead, attention is directed to the number of faulty bits in a chip. If the operational margin is 3σ, the number of faulty bits is 1350±110 (likelihood of 99.6%). In this calculation, not only the equation (1) but also the fact that the number of faulty bits can be approximated by the normal distribution in which an expected value is NF1 and the standard deviation is a square of NF1 (sqrt (NF1)) is used. It should be noted that the probability that random variables normally distributed are comprised within a range of ±3× standard deviation from an expected value is 99.6%. It is now assumed that, if the process has undergone variations beyond the presupposed range, such that the design margin has decreased by only 0.05σ. The number of faulty bits then is changed to 1589±119. Since the number of the faulty bits is varied sensitively in response to the value of the operational margin, it becomes possible to accurately determine the minute change in the operational margin by focusing the attention on the change in the number of faulty bits. In the present Example, a chip in which the number of the faulty bits under the faulty bit count condition exceeds 1350 should be discarded, because the design margin with such a chip is deduced to be below the intended lower limit. Conversely, a chip in which the number of the faulty bits under the faulty bit count condition is not larger than 1350 can be shipped. By so doing, only the products in which the operational margin is below 6σ may reliably be discarded without wastefully discarding the products of high reliability.

Certain preferred Examples of the present invention will now be described in detail with reference to the drawings.

Example 1

Figure 7:
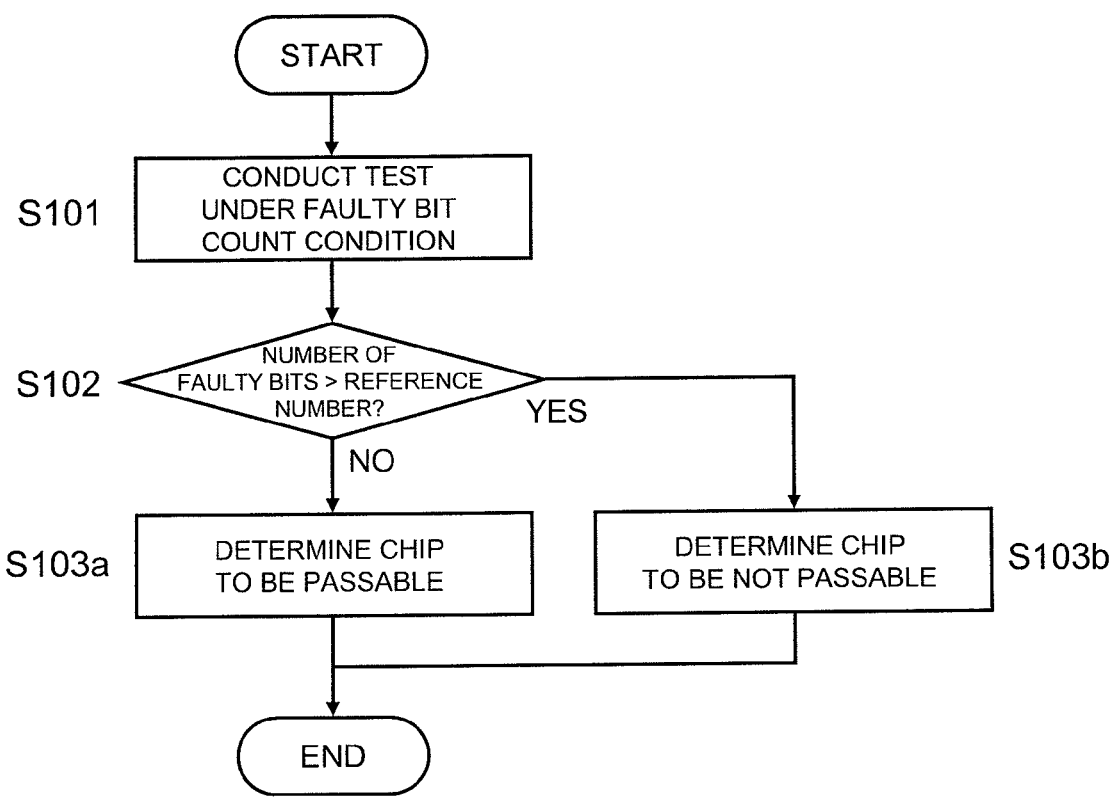
FIG. 7 is a flowchart for a test method according to Example 1 of the present invention.

FIG. 7 shows a basic flowchart of a test method for an information storage device according to Example 1 of the present invention. Firstly, under a condition, specified by a combination of the power supply voltage and temperature, severer than the real use condition, that is, under the faulty bit count condition, all of the memory bits of a given chip, viz., an information storage device, are checked to see if they perform a normal operation. The number of failed memory bits (step S101) is determined. It is then checked whether or not the number of the faulty bits exceeds a preset reference number not less than 1 (step S102). In case the number of the faulty bits is not larger than the preset number, the chip of interest is determined to pass the test (step S103a). In case the number of the faulty bits exceeds the reference number, the chip of interest is determined to not passable the test (step S103b).

It should be noted that the test of the above sort is usually conducted in combination with other tests, although this has not been stated for simplicity of explanation. In the description to follow, the expression 'good product' and 'passing a test' are used to denote respective different states. Viz., in the individual tests, it is determined whether or not a chip will pass a test. Such a chip that has passed all of the necessary tests needed is determined to be a 'good product', while the chip that has not passed any of these tests is determined to be a 'reject'.

The faulty bit count condition can be realized by applying a power supply voltage outside the power supply voltage range anticipated in light of the design specifications. Since it is the low voltage that may most probably cause failed operations, a voltage lower than a design voltage is usually applied. In addition, it is preferred to use such a temperature environment corresponding to the upper or lower limit value of the temperature range as anticipated in light of the design specifications. Hence, from the perspective of ease in condition setting, it is preferred to set the faulty bit count condition not by adjusting the temperature but rather by adjusting the voltage whose setting may be changed more easily. It should be noted that the faulty bit count condition may also be set by adjusting not the power supply voltage but the temperature so as to be outside the anticipated range.

The specific temperature and power supply voltage in the faulty bit count condition may be determined using, for example, a Monte Carlo circuit simulation, so that the value of NF1 (an expected value of the number of faulty bits) in case the process condition has become worst equals a desired value. Or, the test condition under which the number of faulty bits equals a desired value may also be determined by actual measurement of a real storage device, which is fabricated by intentionally adjusting the process conditions to mimic the worst condition anticipated.

Example 2

Figure 8:
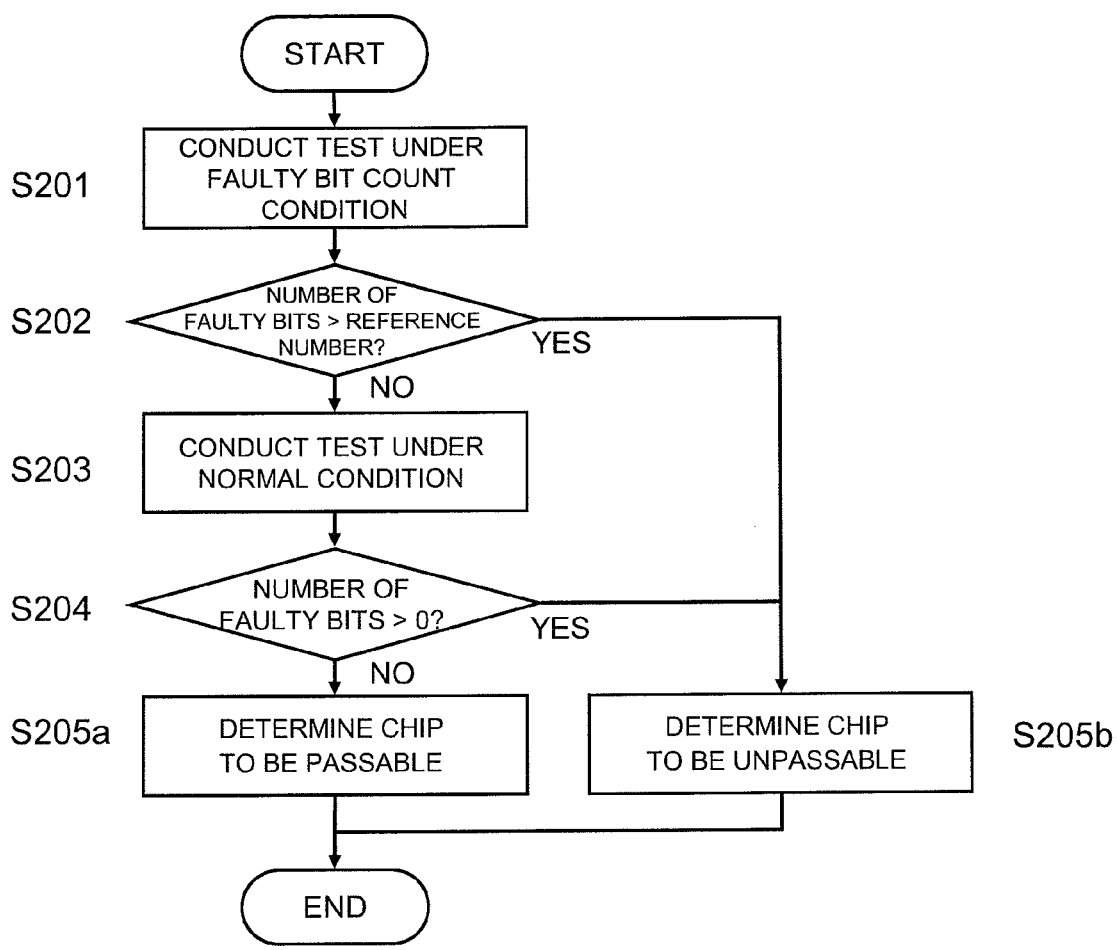
FIG. 8 is a flowchart for a test method according to Example 2 of the present invention.

The test under the faulty bit count condition is desirably used in combination with conventional tests (tests under normal conditions). The reason is that, in the test under the faulty bit count condition, it can be confirmed that sufficient operational margin is secured, while it is not possible for the present test to satisfactorily substitute the conventional tests, which are intended to confirm whether or not all of the bits will operate normally. FIG. 8 shows a flow chart of Example 2 in which the test under the faulty bit count condition is combined with a test under the usual condition. A chip determined to have passed the test under the faulty bit count condition, viz., a chip (information storage device) confirmed to have sufficient operational margin (NO in step S202) is further tested under the normal condition (step S202). Only a chip that has been confirmed in the normal test that the operation of all of the bits is normal (NO in a step S204) is qualified as a good product (step S205a). Otherwise, a chip is determined to be a reject (step S205b).

Example 3

Figure 9:
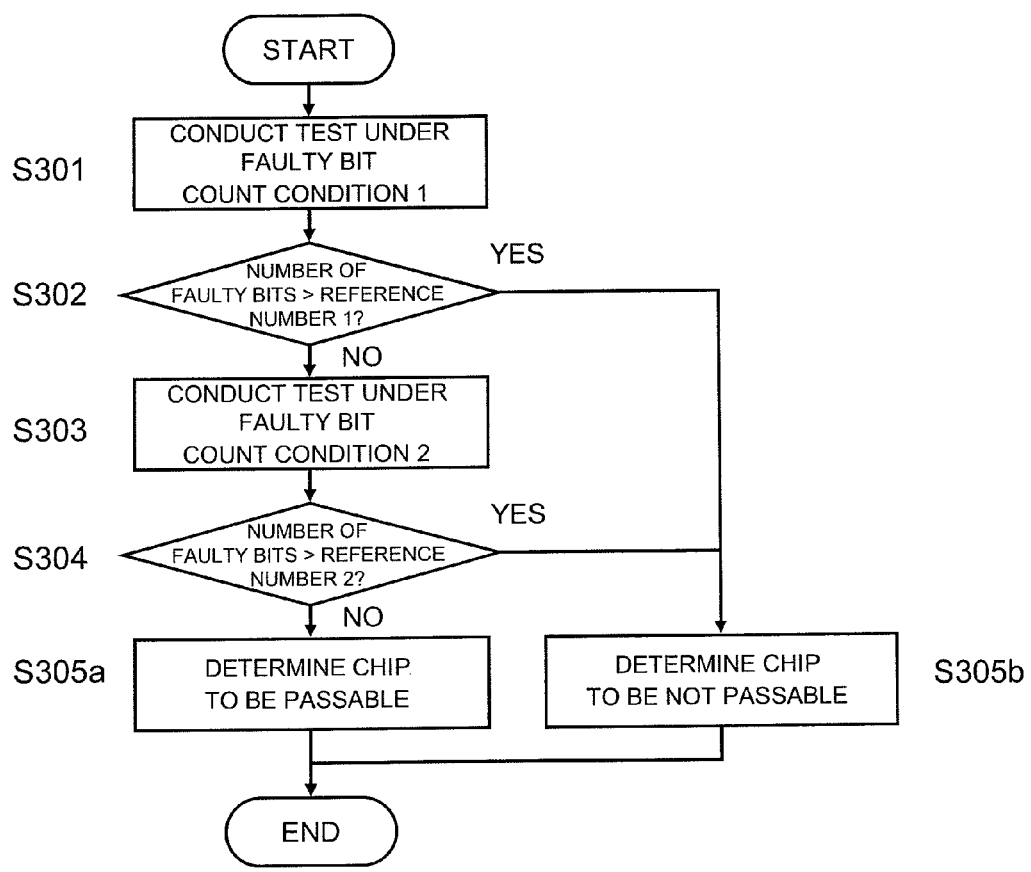
FIG. 9 is a flowchart for a test method according to Example 3 of the present invention.

The test under the faulty bit count condition may be conducted under a plurality of conditions as necessary. FIG. 9 shows a flowchart of Example 3 in which the test under the faulty bit count condition is conducted under two different conditions. Only a chip that has passed a test under a first faulty bit count condition (faulty bit count condition 1) and that also has passed a test under a second faulty bit count condition (faulty bit count condition 2) is determined to have passed the test. Otherwise, a given chip is determined not to have passed the test. For example, in an SRAM, the faulty bit count condition 1 is assumed to be such condition in which the readout operation is difficult (low voltage and high temperature), whilst the faulty bit count condition 2 is assumed to be such condition in which the write operation is difficult (low voltage and low temperature). It is then possible to determine whether or not a sufficient operational margin is assured for both the readout and write operations.

It should be noted that the Examples 1 to 3 shown in FIGS. 7 to 9 are not restrictive such that the test under the faulty bit count condition and the test under a normal condition as necessary may be carried out any number of times in combination. The sequence of carrying out the tests may be interchanged as desired.

In the test under the usual condition, aimed to confirm that all of the bits perform normal operations, it is required to confirm in the least that, for the total of the bits, 0 is read out when 0 has been written and 1 is read out when 1 has been written and that only the bit which succeeded in both of the trials is determined to have passed the test. However, in a test under the faulty bit count condition, the objective of measuring the operational margin is attained by counting only the number of faulty bits in case 0 is not read out when 0 has been written or only the number of faulty bits in case 1 is not read out when 1 has been written. Thus, under the faulty bit count condition, it is sufficient that only one of the two count operations is carried out, thus saving the test time.

It is allowable that the above described 'normal operation of all of the bits' is attained by using redundancy bits. The present invention may be applied without any inconvenience to an information storage device having redundancy bits.

It should be noted that, in the faulty bit count condition, if the expected number of faulty bits NF1 when the process is in the worst condition is not less than 1, a beneficial effect is obtained. However, it is desirable that the expected value NF1 is at least 10 or more, and more desirably not less than 100 and most desirably not less than 1000. Stated differently, the number for reference used in determining whether or not the operational margin is sufficient is desirably at least 10 or more, more desirably not less than 100 and most desirably not less than 1000. For example, in the above example case, even if the operational margin is constant at $3\sigma$, the number of faulty bits is not necessarily equal to NF1 (i.e. 1350) at all times and is statistically varied in its vicinity, with its standard deviation being sqrt(NF1). Hence, the relative variation of the actual number of faulty bits, with respect to the expected value NF1, is sqrt(NF1)/NF1=1/sqrt(NF1), which becomes larger as NF1 decreases. Thus, if NF1 is too small, it becomes difficult to accurately determine the change in the operational margin. Assuming that the operational margin is fixed, and if the expected number NF1 is 1000, the range of scatter of the actual number of faulty bits will be approximately ±10%, whereas, if the expected number NF1 is 10, the range of scatter of the actual number of faulty bits will be approximately ±100%. To increase NF1, it is sufficient that the setting values of the power supply voltage or the temperature is changed towards severer values. However, such condition in which NF1 exceeds ½ of N is not desirable. This is because the rate of change of NF1 relative to the change of the operational margin (sensitivity) is then decreased.

The following Table 1 collectively shows the relationship between the above mentioned expected number of faulty bits NF1 and the range of variations $3\sigma$ (thrice the standard deviation $\sigma$). NF1 can be chosen arbitrarily, depending on the desired value of the $3\sigma$/NF1 confidence range. Table 1 shows the standard deviation $\sigma$, three times the standard deviation $3\sigma$, and the relative range of variation $3\sigma$/NF1, for the NF1 (i.e. the reference number for the pass/fail decision) of 10, 100, 300 and 1000.

TABLE 1

EXPECTED NUMBER AND RANGE OF VARIATIONS OF THE NUMBER OF FAULTY BITS

| EXPECTED NUMBER OF FAULTY BITS (NF1) | $\sigma$ | $3\sigma$ | $3\sigma$/NF1 |
|---|---|---|---|
| 10 | 3.16 | 9.49 | 94.9% |
| 100 | 10.00 | 30.00 | 30.0% |
| 300 | 17.32 | 51.96 | 17.3% |
| 1000 | 31.62 | 94.87 | 9.5% |

If the reference number (i.e. NF1) is set to be 10 or larger, more or less certain reliability may be obtained (in Table 1, the range of confidence $3\sigma$/NF1 is less than 100%). If higher confidence is desired for the decision, it is sufficient that the faulty bit count condition is set to a severer condition and the reference number is increased (if, in Table 1, the value of reference number NF1 is increased, the range of confidence becomes smaller). However, it is not desirable to set such faulty bit count condition that the reference number NF1 exceeds ½ of N, as noted above. Meanwhile, $\sigma$ in Table 1 is not the standard deviation of the operational margin shown in FIG. 6 or referred to subsequently with reference to FIG. 10, but is a standard deviation of the number of faulty bits. Attention is to be directed to the fact that distinction should be made between the standard deviations of the two variables, although the same symbol $\sigma$ is here used.

Example 4

The method of determining the excess or shortage of the value of the operational margin based on the number of faulty bits under the single faulty bit count condition has been described in the foregoing. It is however also possible to decide on the possible presence of manufacturing problems based on the number of bits under two different faulty bit count conditions of the same sort (the conditions differing only with respect to the degree of severity). If two or more conditions are used, it becomes possible to detect that the very magnitude of the random variations of a memory cell has changed.

In Example 3, the excess or shortage of the value of the operational margin is determined under a plurality of different sever conditions to decide on the pass/fail of a product under test. In the present Example 4, the number of faulty bits is counted under each of conditions of the same sort differing in severity. The value of the random variations is determined based on the result of the count operation.

Figure 10:
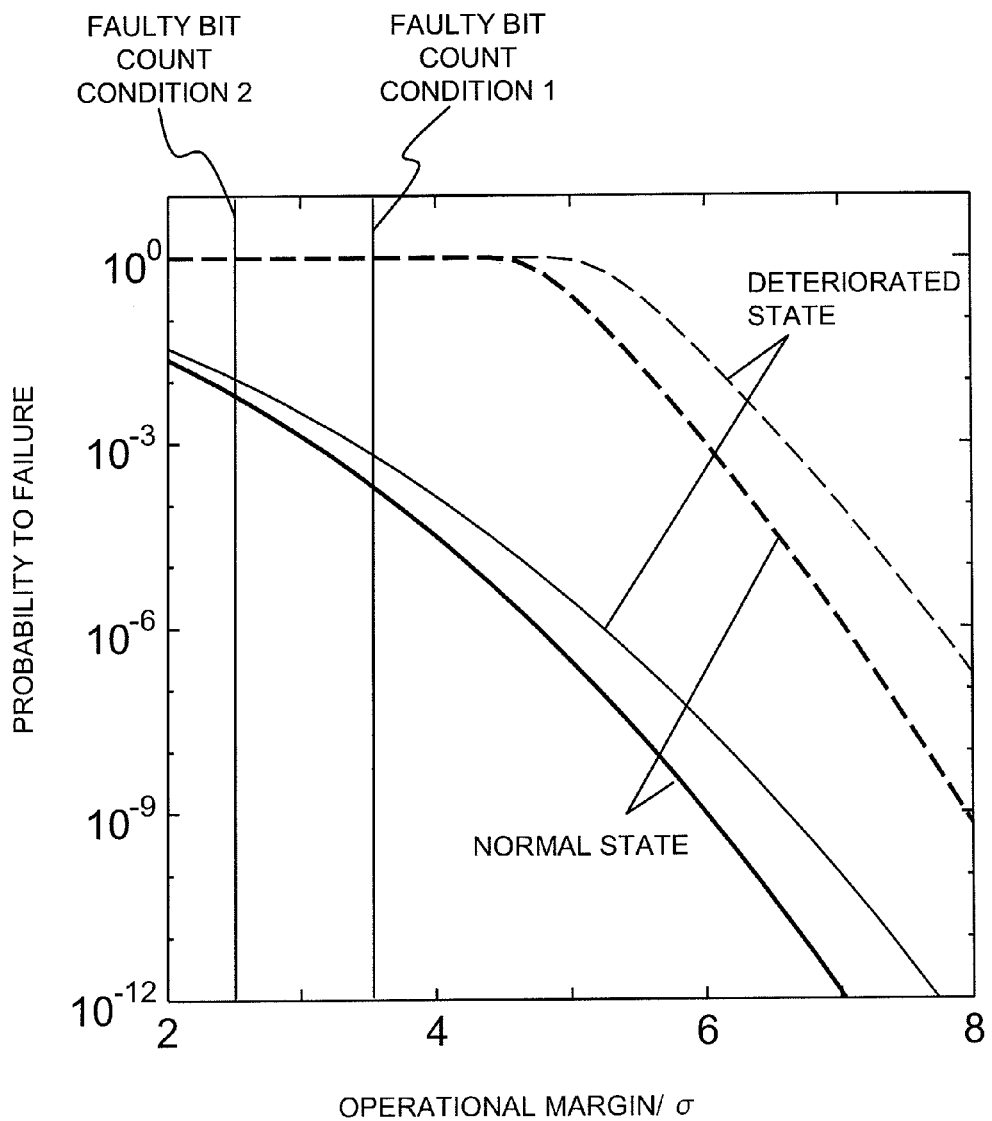
FIG. 10 is a graph showing the relationship between the test condition of Example 4 and the probability to failure.

In FIG. 10, the 'deteriorated state' means such a state in which the standard deviation of the random variations has increased from the normal value σ of the standard deviation in the 'normal' state to 1.1σ. In case the value of the standard deviation has increased this way, there is a possibility that a certain manufacturing problem has occurred. How much the standard deviation has increased may be known from the ratio of the numbers of faulty bits as measured under the two conditions, such as the 'faulty bit count condition 1' and the 'faulty bit count condition 2' differing in severity from each other. The smaller the count value of the faulty bits under the severer faulty bit count condition, such as the 'faulty bit count condition 2', divided by the count value of the faulty bits under the more moderate faulty bit count condition, such as the 'faulty bit count condition 1', the larger is the value of the standard deviation, i.e. the inclination of a curve shown in FIG. 10 is more moderate. The specific value of the standard deviation may be calculated using the equation (1). By detecting, in this manner, a change in the standard deviation itself of the random variations by a test, it is possible to detect the occurrence of a manufacturing problem to prevent a product low in reliability from being shipped.

Example 5

The test methods of Examples 1 to 4 may be executed by formulating a program in order to have a commercially available memory tester execute the operation as explained with reference to FIGS. 7 to 9. In general, a memory tester includes, in addition to a measurement unit for measuring electrical characteristics of the information storage device, a central processing unit, a memory and an input/output unit similar to those provided in a general computer. The program can be stored in the memory to instruct the central processing unit to carry out the test method according to the Examples 1 to 4.

Figure 11:
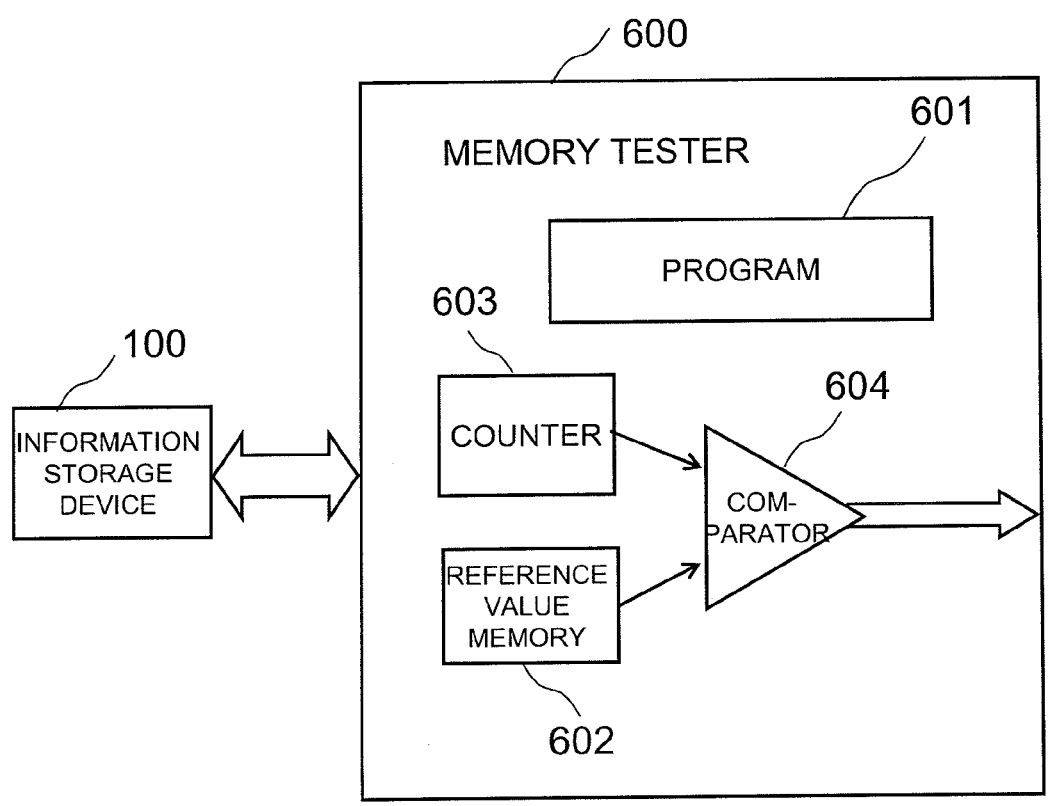
FIG. 11 is a functional block diagram of a memory tester according to Example 5.

FIG. 11 shows a functional block diagram of a memory tester 600 according to Example 5. In FIG. 11, some of the general features of a memory tester, which apply test patterns to the information storage device 100 in accordance with specified test conditions, to verify the pass or fail of the pattern output from the information storage device 100, is not described, and only the features characteristic of the Example 5 is described. The memory tester 600 of FIG. 11 has a program 601 of Example 5 installed thereon, and runs the program 601, whereby the central processing device, not shown, and the memory, not shown, of the memory tester 600 operate as a reference value memory unit 602, a counter 603 and a comparator 604, shown in FIG. 11. The reference value memory unit 602 is a memory that presets and stores a reference value (reference number) in FIGS. 7 to 9. The counter 603 operates as a counter that counts up each time a memory bit that failed in its operation is detected. The comparator 604 compares the number of the failed memory bits counted by the counter 603 to the reference value of the reference value memory 602. The comparater decides that the information storage device has failed the test if the count value exceeds the reference value, or has passed the test if the count value does not exceed the reference value, and outputs the result to outside the memory tester. In other word, the counter 603, the comparator 604, and the central processing device function as a faulty bit counting unit. The faulty bit counting units counts the number of faulty bits in the information device 100 and decides that the information storage device 100 has failed in case the count value has exceeded the reference value stored in the reference value memory unit 602.

Example 6

Figure 12:
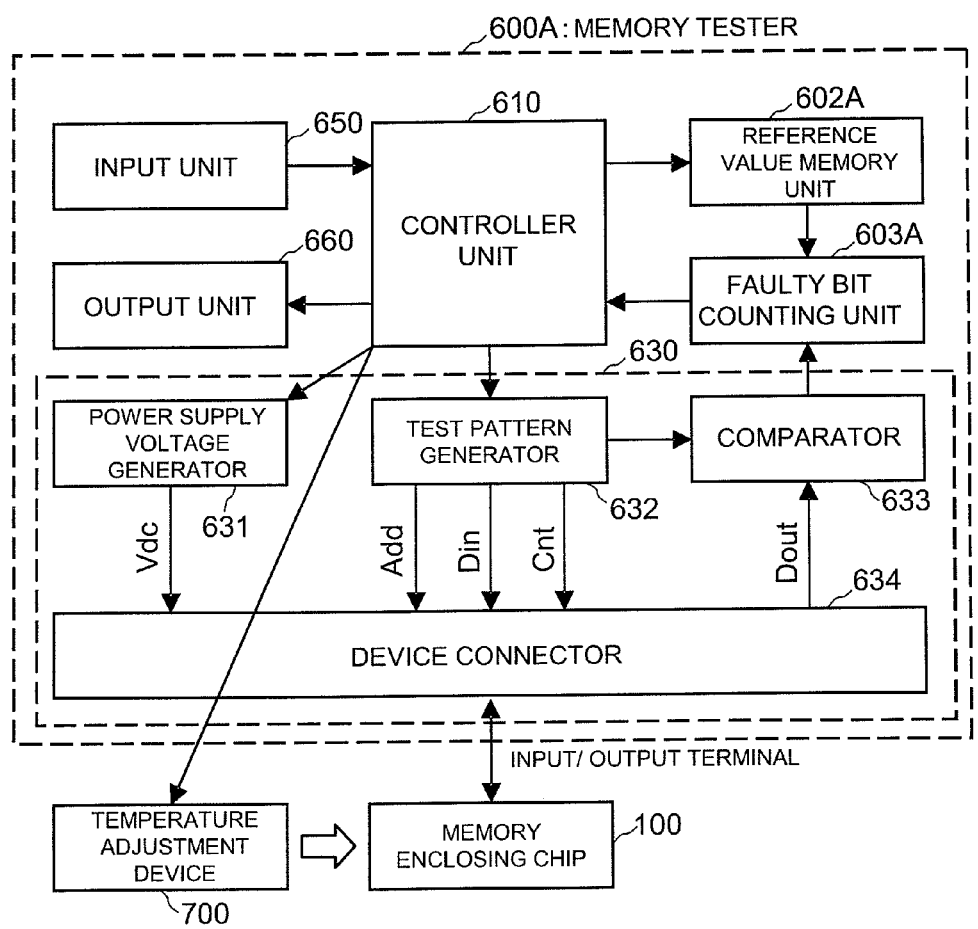
FIG. 12 is a functional block diagram of a memory tester according to Example 6.

FIG. 12 shows an example configuration of the memory tester 600A. By using the memory tester 600A of FIG. 12, the test method of the above Examples 1 to 4 may be executed easily. A controller unit 610 controls the overall operation of the memory tester. To improve the versatility, the controller unit 610 is preferably constructed by a CPU and a memory. An input unit 650 includes e.g., a keyboard and inputs the information, controlling the controller unit 610, from outside. An output unit 660 includes e.g. a display, and outputs information such as test results. A test execution unit 630 applies a power supply voltage and an input pattern to a memory enclosing chip (information storage device) under test, while comparing a pattern output from the memory enclosing chip 100 to an expected value pattern to carry out the test under control by the controller unit 610.

The test execution unit 630 includes a power supply voltage generator 631, a test pattern generator 632, a comparator 633 and a device connector 634. The power supply voltage generator 631 generates an arbitrary power supply voltage to be supplied to the memory enclosing chip 100. The test pattern generator 632 sequentially generates an address Add and input data Din, while also generating a control signal Cnt that controls the write/readout operation of the memory enclosing chip 100. The address Add and input data Din are used for conducting a memory test of the memory enclosing chip 100 which is under test. The comparator 633 checks the coincidence between output data Dout of the memory enclosing chip 100 and a pattern of expected values output by the test pattern generator 632. The output data Dout may be one bit or composed of a plurality of bits. The device connector 634 delivers a power supply voltage Vdc, an address Add, input data Din and a control signal Cnt to preset terminals of the memory enclosing chip 100, through input/output terminals and power supply terminals of the memory enclosing chip 100. In addition, the device connector 634 connects the output data Dout, output from a data output terminal of the memory enclosing chip 100, to the comparator 633.

A faulty bit counting unit 603A is a counter that counts the number of faulty bits contained in the sole memory enclosing chip 100. The faulty bit counting unit 603A has its count value reset to 0 before commencing the testing of the memory enclosing chip 100. The faulty bit counting unit 603A also counts up each time the comparator 633 detects a faulty bit based on the result of comparison of the output data Dout of the memory enclosing chip 100 and the pattern of the expected values to each other. A reference value memory unit 602A is a register that stores the number of faulty bits which is to be the reference of passable/not passable decision. Before testing, the controller unit 610 records the number of faulty bits which is to be the reference for passable/not passable decision. In testing, the faulty bit counting unit 603A counts the number of faulty bits of the memory enclosing chip 100. At the same time, it compares the number of the faulty bit to the reference number stored in the reference value memory unit 602A. If the number of the filled bits exceeds the reference number, the memory enclosing chip 100 is determined to not passable in the test. To simply determine whether or not the memory enclosing chip 100 is to pass the test, the memory enclosing chip 100 may be determined to not pass the test when the number of the faulty bits has exceeded the reference number. The test for the memory enclosing chip 100 may then be terminated.

To provide for high-speed testing, the test pattern generator 632, comparator 633, the faulty bit counting unit 603A and the reference value memory unit 602A are desirably implemented as the hardware distinct from the memory or the CPU making up the controller. In this manner, the testing of the memory enclosing chip 100 may be executed speedily.

The memory tester 600A may possess the function of instructing a setting temperature for a temperature adjustment device 700. This temperature adjustment device 700 is used for adjusting the measured temperature of the memory enclosing chip 100 whose temperature is being measured. With the memory tester 600A, the setting temperature of the power supply voltage generator 631 may be controlled to adjust the power supply voltage, while the temperature adjustment device 700 may be controlled to adjust the temperature. It is also possible with the memory tester 600A to control a test circuit enclosed within the memory enclosing chip 100 via the control signal Cnt to implement the severe test environment. Meanwhile, it is sufficient for the temperature adjustment device 700 to set the temperature of the memory enclosing chip 100 to a specified state for use whenever it is necessary to conduct a test. The temperature adjustment device 700 is not needed in case the power supply voltage or the memory access timing is set to certain severe conditions at ambient temperature to implement the faulty bit count condition.

Example 7

The information storage device convenient in applying the present invention will now be described. To implement the faulty bit count operation in the present invention, the necessity may arise to set the power supply voltage to an extremely low value. As a result, it may sometimes occur that the operation not only of the circuit that composes the memory bit (memory cell) but also that of the peripheral that writes data in or reads out data from the memory cell is destabilized. If storage failure ascribable to the peripheral should occur, such failure is deterrent to the objective of the present invention to measure the operational margin of the memory bit. To cope with such problem, the voltage delivered to the memory cell may be made different from the voltage supplied to the peripheral circuit or to at least a part of the peripheral circuit.

For example, in an information storage device that uses the test method of the above described Examples 1 to 4, a chip (information storage device) may be provided with separate terminals for supplying the power supply voltage to be delivered to the memory cells and for supplying the power supply voltage to be delivered to the peripheral circuit. To implement the faulty bit count condition, the power supply voltage for the peripheral circuit is set so as to be higher than that for the memory cell. For example, the power supply voltage for the peripheral circuit is in a voltage range for normal use condition and only the power supply voltage for the memory cell is set so as to be lower than that for the usual use condition. By so doing, the test method according to the present invention may be applied without detracting from the stability of the peripheral circuit.

In the SRAM of FIG. 2, the voltage at the access time on a word line (WL in FIG. 2) may be made higher than the power supply voltage of the memory cell (VCC in FIG. 2) to facilitate occurrence of readout failures, viz., to reduce SNM. Conversely, the power supply voltage of the memory cell may be made higher than the voltage at the access time on the word line to facilitate the occurrence of the write failures. It should be noted that the access time denotes such a state where the transistors a1 and a2 in FIG. 2 are both conductive. Thus, with the SRAM, the power supply voltage VCC of the memory cell may be made different from the voltage at the access time to the word line WL, whereby the condition where many faulty bits are more liable to be produced, viz, the faulty bit count condition, may be implemented more readily.

For example, in the information storage device that uses an SRAM in which the test methods according to Examples 1 to 4 are applied, the chip may be provided with terminals for separately supplying the power supply voltage for the memory cells and the power supply voltage supplied to the word line driver circuit. These two terminal voltages may be made different from each other when the faulty bit count condition is to be set. By so doing, the condition under which many faulty bits are more liable to be produced, viz., the faulty bit count condition may be set more easily. To help produce the readout failures, it is beneficial to set the power supply voltage to be supplied to the word line driver circuit higher than the power supply voltage of the memory cells. To help produce the write failures, it is beneficial to reverse the relationship between the two power supply voltages.

Figure 13:
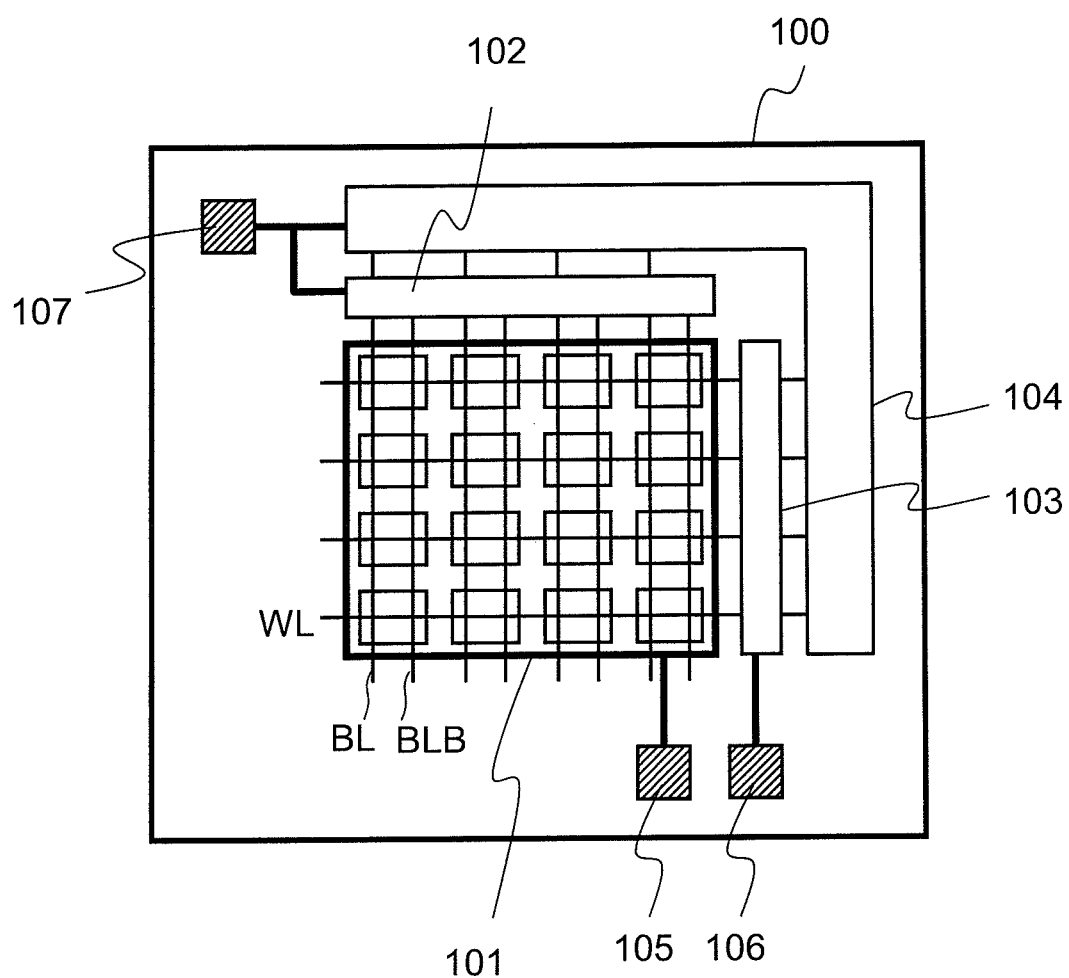
FIG. 13 is a circuit diagram of an SRAM to which the test method according to the present invention may be applied.

FIG. 13 shows a preferred example formulation of an information storage device employing an SRAM for more facilitated application of the present invention. It should be noted that certain components or details are not shown provided that these components or details are not essential to understanding the present example formulation. The information storage device 100 includes a memory cell array 101, a sense amplifier 102, a word line driver circuit 103 and a control circuit 104. The memory cell array 101 is made up of a large number of, though only 16 are shown herein, SRAM memory cells. The word line driver circuit 103 delivers the potential of the word line coupled to the memory cells, and the control circuit 104 controls the data readout from and data write in the memory cells. The reference numerals 102 to 104 denote peripheral circuits of the information storage device 100. The memory cell array 101, word line driver circuit 103 and the control circuit 104 are provided with power supply terminals 105 to 107 so as to be supplied with different power supply voltages. At the time of shipment, these power supply terminals may be shorted so as to be at the same potential. The power supply voltage, supplied to the sense amplifier 102, is set so as to be equal to that of the control circuit 104.

Figure 14:
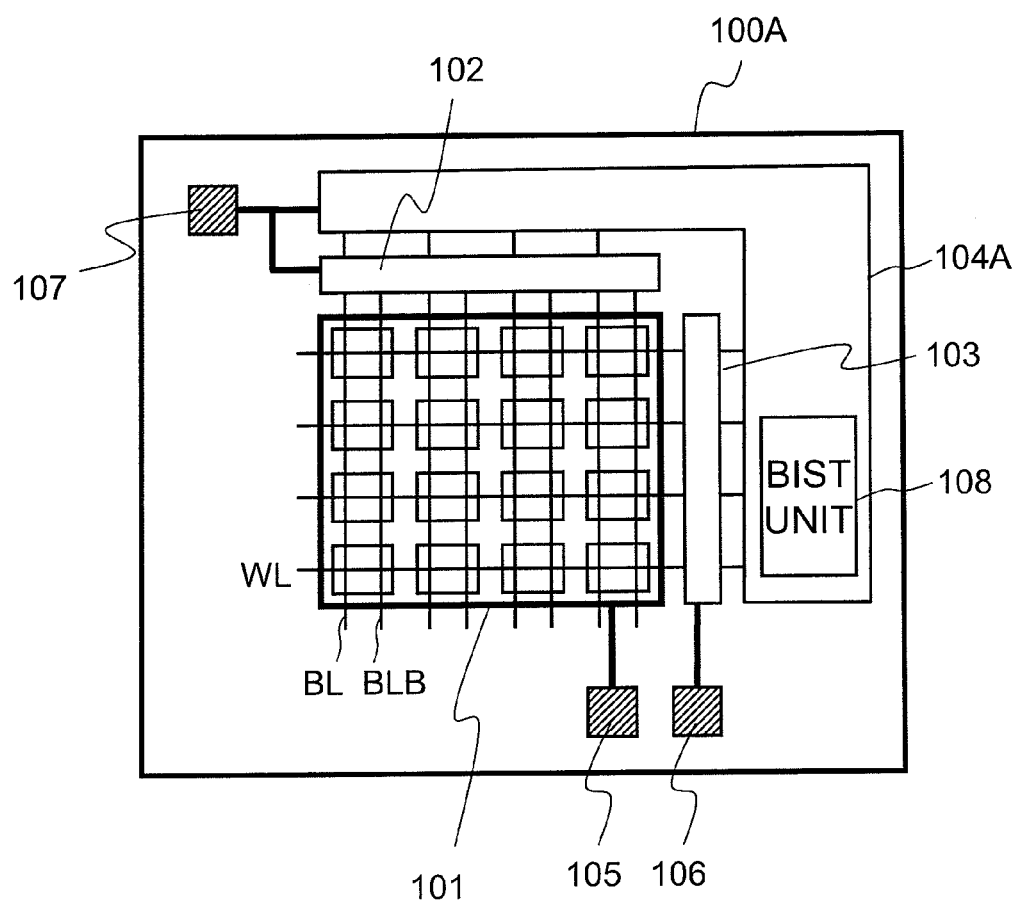
FIG. 14 is a block diagram showing a formulation of an information storage device according to Example 7.

Referring to FIG. 13, the voltage at the power supply terminal 105 is set so as to be lower than that at the power supply terminals 106, 107, whereby it is possible to set the faulty bit count condition with high probability of readout errors more easily as the malfunctions of other parts than the memory cells are prevented from occurring. By setting the voltage at the power supply terminal 106 so as to be lower than that at the power supply terminals 105, 107, the faulty bit count condition with high probability of write errors may be set more easily. In this case, it is desirable that the test is conducted both under a faulty bit count condition for readout in order to confirm the operational margin for readout, and under a faulty bit count condition for write in order to confirm the operational margin for write. The above test may also be executed using the memory testers 600, 600A of Examples 5 and 6 as well Preferably, the function of carrying out the tests of the Examples 1 to 4 and the information storage device under test may be formed as one with each other. Viz., the function of carrying out the test may be provided as part of a built-in self test function (BIST function). For such case, it is required of the information storage device to include a BIST unit, which BIST unit at least needs to possess the function of counting the number of faulty bits. FIG. 14 depicts a block diagram of the information storage device 100A having the built-in self test function of Example 7. The information storage device 100A of FIG. 14 includes a peripheral circuit 104A having embedded therein a BIST unit 108. The information storage device 100A of FIG. 14 includes a control circuit 104A, a peripheral of the information storage device shown in FIG. 13. In the inside of the BIST unit 108 of FIG. 14, there are provided the functions of the reference value memory 602, counter 603 and the comparator 604 shown in FIG. 11.

Figure 15:
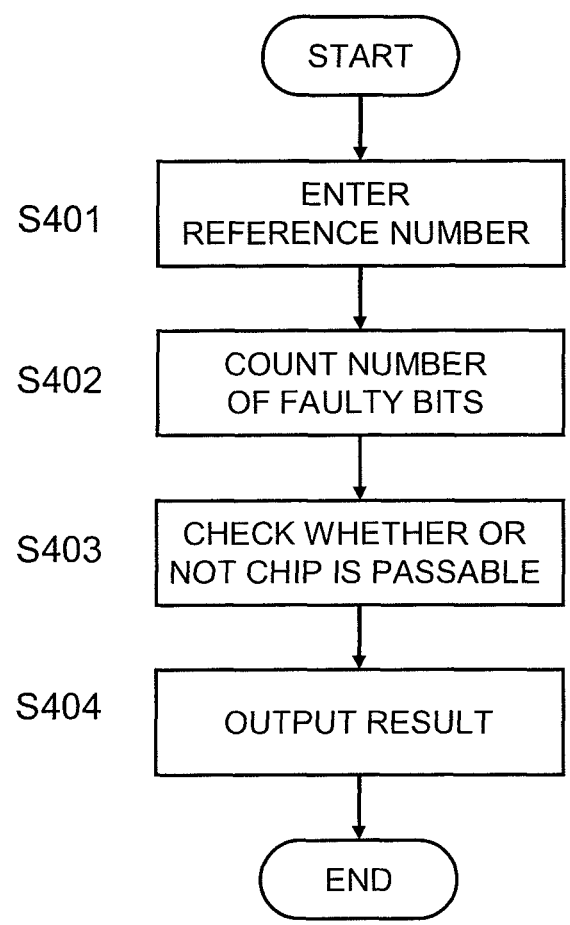
FIG. 15 is a flowchart for illustrating the operation of a self-test of the information storage device according to Example 7.

FIG. 15 depicts a flowchart showing the steps of a self-test in case the BIST unit 108 of the information storage device 100A of FIG. 14 is run in operation. Initially, a reference number is entered at an arbitrary terminal of the chip to be temporarily stored in a reference value memory contained in the BIST unit 108 (step S401). The number of faulty bits is then counted (step S402). It is then determined whether or not a chip of interest will pass a test, depending on whether or not the number of faulty bits exceeds the reference number (step S403). Finally, the result of decision is output at an arbitrary terminal of the chip (step S404). If the reference number is predetermined, it can be recorded in the BIST unit at e.g., manufacture time, in which case the step S401 may be dispensed with.

Example 8

Figure 16:
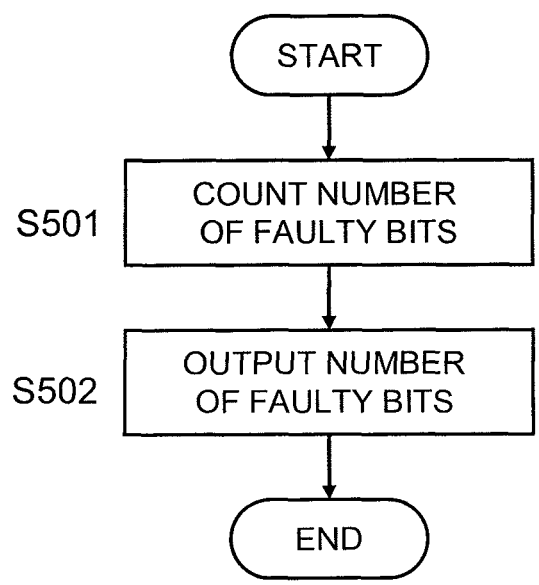
FIG. 16 is a flowchart for illustrating the operation of a self-test of the information storage device according to Example 8.

FIG. 16 depicts a flowchart showing another example operation of the BIST unit of the information storage device of Example 8. The information storage device of Example 8 may be implemented by modifying the function of the BIST unit 108 of the information storage device 100A of Example 7. In the present Example 8, the number of fault bits is counted in the BIST unit, as shown in FIG. 16 (step S501). The number of the faulty bits obtained is then output to outside via an arbitrary chip terminal. The passable/not passable of the chip of interest is determined by, for example, a memory tester outside the information storage device.

The BIST unit, explained in connection with Examples 7 and 8, may additionally include the function of controlling, for itself, the power supply voltage to be supplied to each part of the information storage device, at the time point of counting the number of faulty bits, to a value suited to realize the faulty bit count condition. To this end, the information storage device of Examples 7 and 8 may have the function of converting the voltage, supplied from outside, to another voltage as appropriate. The BIST unit may further include the function of controlling, for itself, the temperature of the information storage device, at the time point of counting the number of faulty bits, to a temperature suited to realize the faulty bit count condition. To this end, the information storage device may include a heater wire for heating, whilst the above mentioned BIST unit may include a control circuit for driving the heater wire.

Example 9

Figure 17:
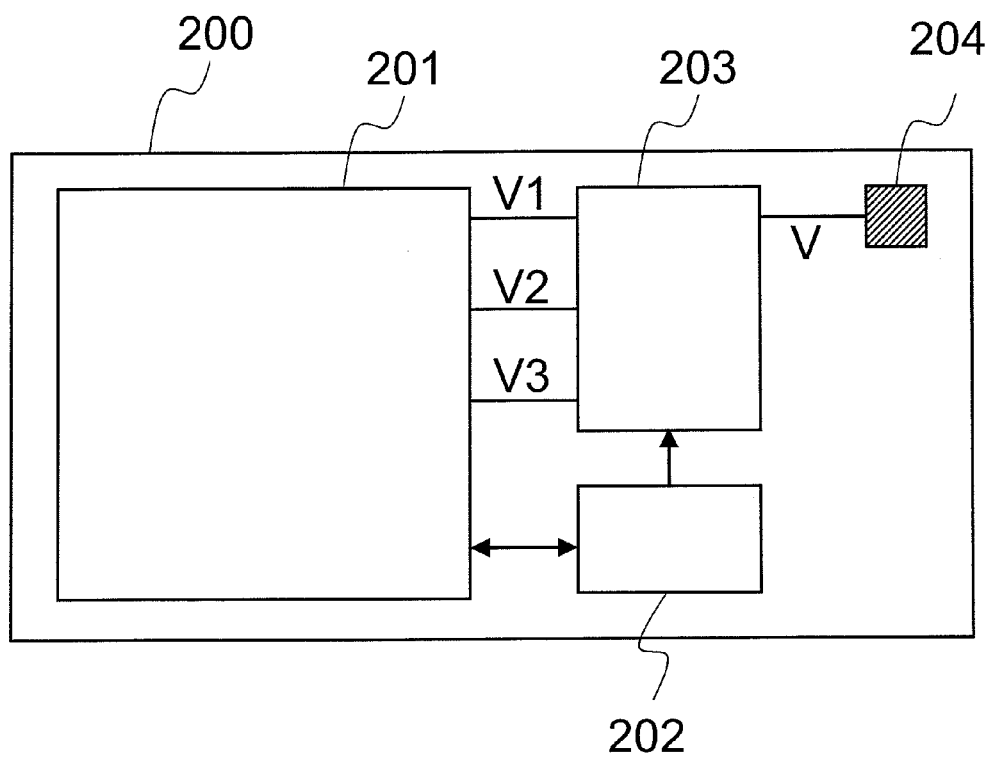
FIG. 17 is a block diagram showing a formulation of an information storage device according to Example 9.

FIG. 17 shows an information storage device 200 of Example 9. The information storage device 200 of FIG. 17 includes a voltage controlling function. The information storage device 200 includes a main part of the storage device 201, provided with a memory cell array, a BIST unit 202, a power supply conversion device 203 and a power supply terminal 204. To the main part of the storage device 201, a power supply voltage is supplied from the power supply terminal 204, an external terminal, via the power supply conversion device 203. In FIG. 17, there is shown a configuration in which the power supply conversion device 203 supplies a plurality of different voltages (V1 to V3). However, only one voltage may also be supplied. The voltages V1 to V3 correspond to voltages supplied to the terminals 105 to 107 of FIG. 13, for example. During the time of the normal operation other than the test time, the BIST unit 202 instructs the power supply conversion device 203 to control V1 to V3 to be of desired values. The power supply conversion device 203 may be arranged outside the semiconductor chip that constitutes the main part of the storage device 201 as necessary.

Example 10

Figure 18:
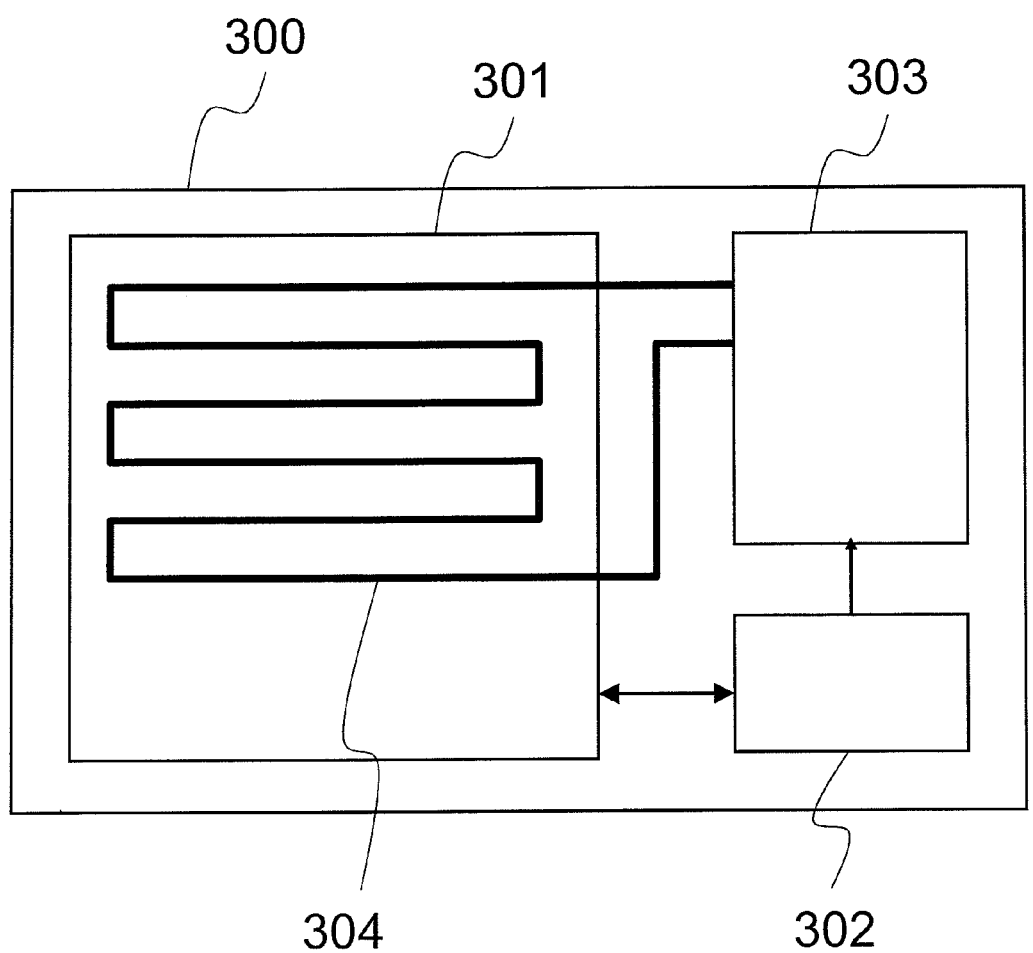
FIG. 18 is a block diagram showing a formulation of an information storage device according to Example 10.

FIG. 18 depicts a block diagram showing the formulation of an information storage device of Example 10 having a heating function by a heater. An information storage device 300 includes a main part of the storage device 301 and a BIST unit 302. The information storage device also includes a temperature control circuit 303 and a heater 304. During the time of the normal operation other than the test time, the BIST unit 302 instructs the temperature control circuit 303 not to cause the current to flow through the heater 304. In implementing the faulty bit count condition, the BIST unit 302 instructs the temperature control circuit 303 to deliver the current through the heater 304 to elevate the temperature. The temperature control circuit 303 may be arranged outside the semiconductor chip that constitutes the main part of the storage device 301. The BIST unit 302 or the temperature control circuit 303 may further be provided with a temperature measurement circuit that controls the temperature to a desired value.

Example 11

In the above described Examples, description has been made of methods as well as the apparatus for implementing severe test conditions (faulty bit count condition) by adjusting various bias voltages and test temperatures, and a memory tester. However, severe test conditions may be set by other methods than adjusting the bias voltages or the test temperatures. For example, the severe test conditions may also be set by adjusting the various timings.

Figure 19:
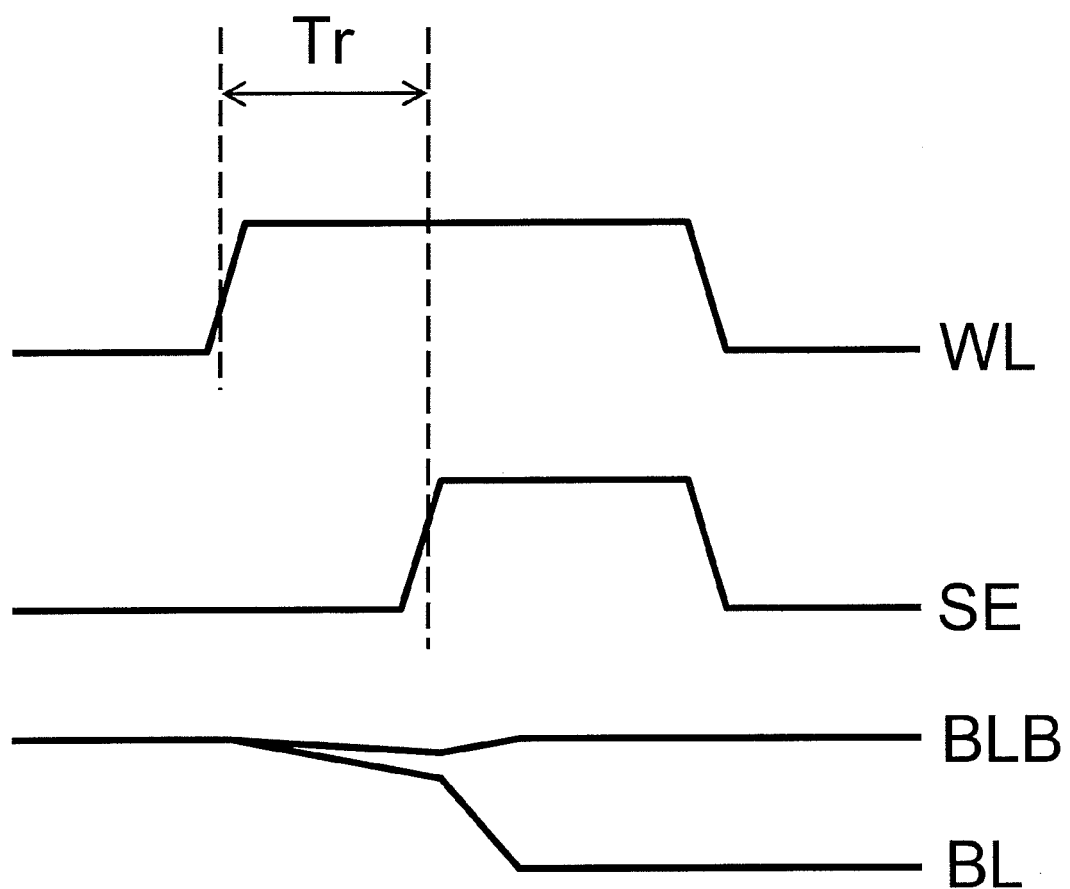
FIG. 19 is a waveform diagram for the readout timing of an SRAM according to Example 11.

FIG. 19 depicts a waveform diagram showing readout timings of an SRAM by Example 11. In FIG. 19, WL, BLB and BL denote the potentials on the word line WL, bit line pair BLB and BL of FIG. 2, respectively. SE denotes a sense amplifier enabling signal that activates the sense amplifier circuit 102 shown in FIG. 13. If, in FIG. 2, the potential on the word line WL is elevated from the LOW level to the HIGH level, as the bit line pair BL and BLB has been precharged to the HIGH level, the N-channel transistors a1, a2 are turned on. If, at this time, the nodes V1, V2 in the inside of the SRAM cell are LOW and HIGH, respectively, mainly the bit line BL is discharged via the cell. The potential on the bit line BL becomes progressively lower than that on the inverting bit line BLB, as shown in FIG. 19. Then, after time lapse of Tr, the difference between the potential on the bit line pair BL and that on the inverting bit line BLB is of a sufficiently large value. At this time, the sense amplifier enable signal SE is raised to HIGH level. The sense amplifier circuit amplifies the potential difference between the bit line pair BL and BLB. Then the information stored in the cell is read out. The time which elapses since the rise of the word line WL until rise of the sense amplifier enable signal SE is set at Tr. If this time Tr is too short, the potential difference between the pair bit lines BL and BLB is so small that the probability becomes high that readout may not be made. The faulty bit count condition concerning the readout timing may be obtained by intentionally setting Tr so as to be shorter than the value under the condition for the normal operation.

Example 12

Figure 20:
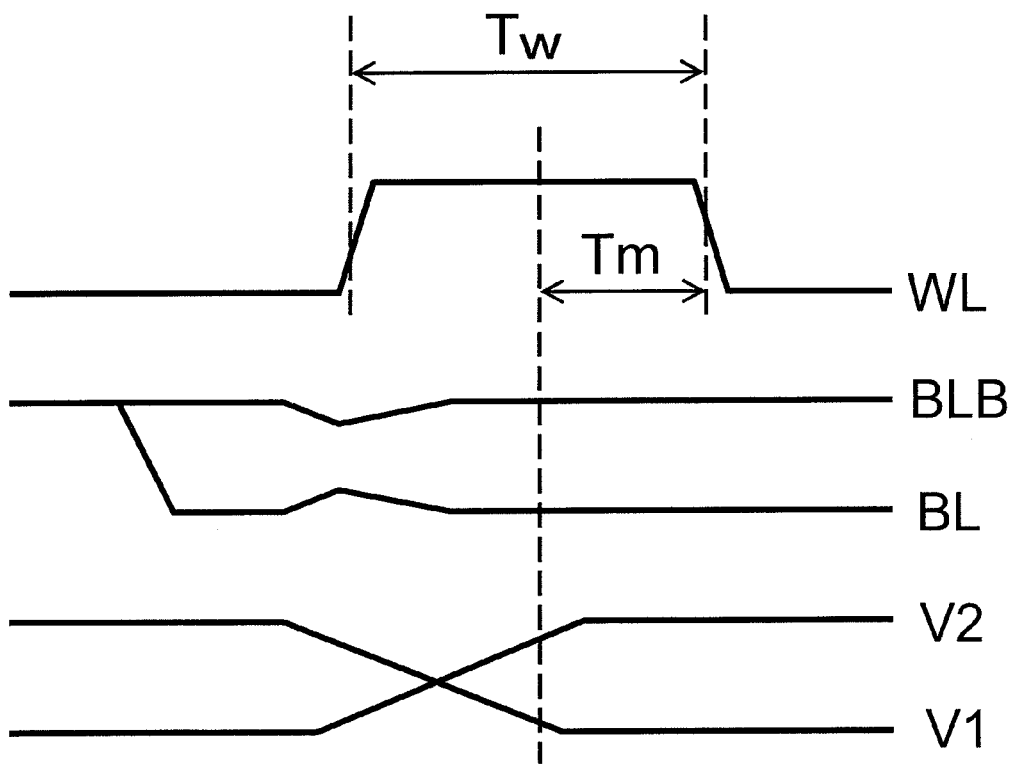
FIG. 20 is a waveform diagram for the write timing of an SRAM according to Example 12.

FIG. 20 depicts a waveform diagram for the write timing for the SRAM of Example 12. In FIG. 20, WL, BLB, BL, V1 and V2 respectively denote the potentials on the word line WL, pair bit lines BL and BLB and on the internal nodes of the memory cell V1, V2 shown in FIG. 2. It is now assumed that, beginning from the initial state in which potentials on the internal nodes V1 and V2 in the memory cell are HIGH and LOW, respectively, a LOW level is to be written on the node V1 and a HIGH level is to be written on the node V2. Based on the write data, the bit line BL is initially set to the LOW level potential from outside, whilst the inverting bit line BLB is set to the HIGH level from outside. The word line WL is then raised from the LOW level to the HIGH level. This turns the N-channel transistors a1, a2 of FIG. 2 to be turned on. The potential on the node V1 is then lowered to follow that on the bit line BL, whilst that on the node V2 is raised to follow the potential on the inverting bit line BLB. The potentials on the bit line BL and on the inverting bit line BLB are sufficiently stable after lapse of time Tw, at which time the word line WL is again set to the LOW level. This completes the write of the information in the cell. If the time Tw is too short, there may not be enough time to invert the potential on the internal nodes V1 and V2, due to variations, thus raising the probability of write failures. The faulty bit count condition for the write timing may be obtained by designing the time Tw so as to be shorter than that of the normal operation on purpose.

Example 13

Figure 21:
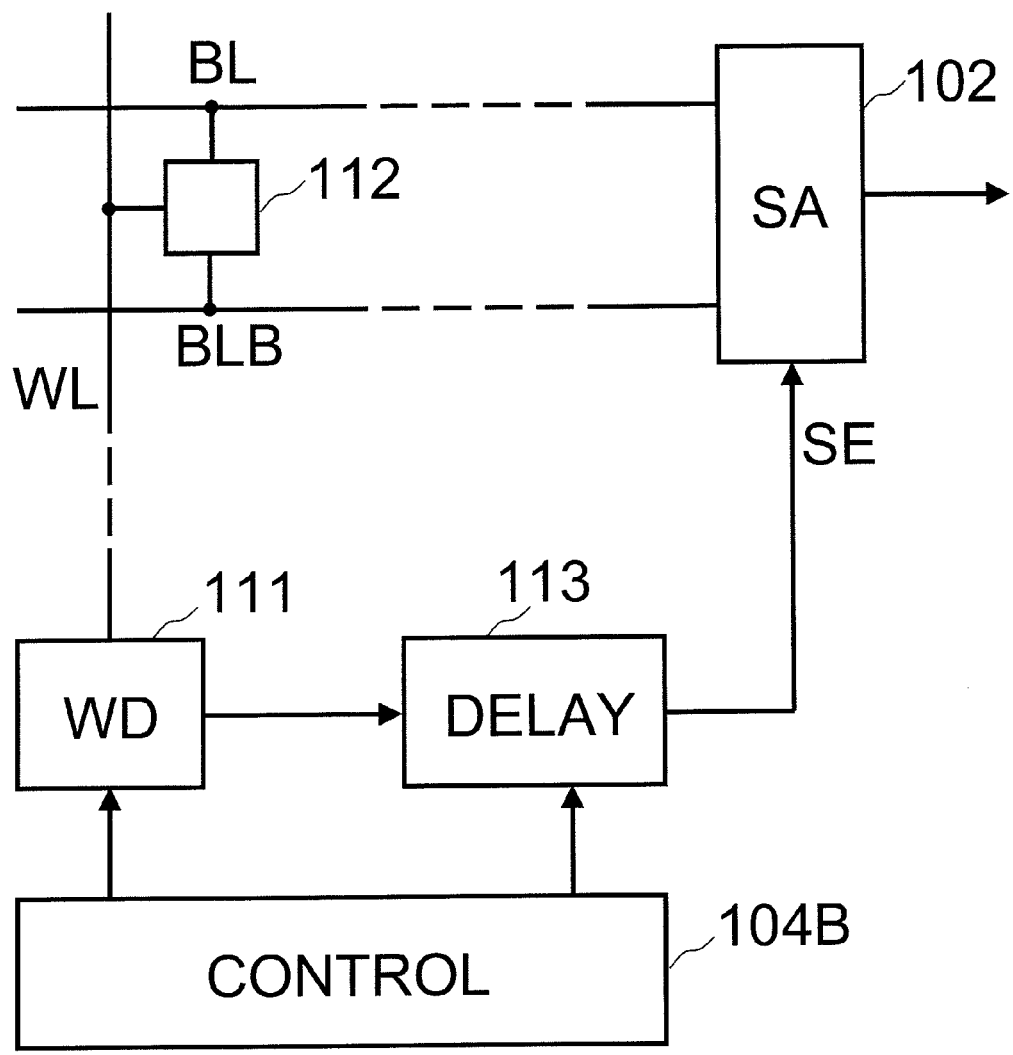
FIG. 21 is a circuit diagram of a readout control circuit of an information storage device according to Example 13.

To conduct the test method of Examples 11 and 12, it is desirable that the information storage device (SRAM chip) internally has the function of generating the timing different from that during the normal use time. FIG. 21 depicts a circuit diagram of a readout control circuit of an information storage device. If the readout control circuit of FIG. 21 is enclosed in the information storage device, the test method of Example 11 may be executed easily. In FIG. 21, a control circuit 104B routes a signal to a word line driver 111 to raise the potential of the word line WL. The word line driver 111 routes a signal to a delay unit 113 at the same time as it raises the potential on the word line WL. This signal is delayed by time Tr by the delay unit 113 and transmitted to the sense amplifier 102 as sense amplifier enable signal SE. The delay unit 113 is able to generate at least two different delay values, namely a delay for the normal use state and a test delay shorter than the delay for the normal use. The delay unit 113 is configured to select one of the two based on an instruction of the control circuit 104B.

Example 14

Figure 22:
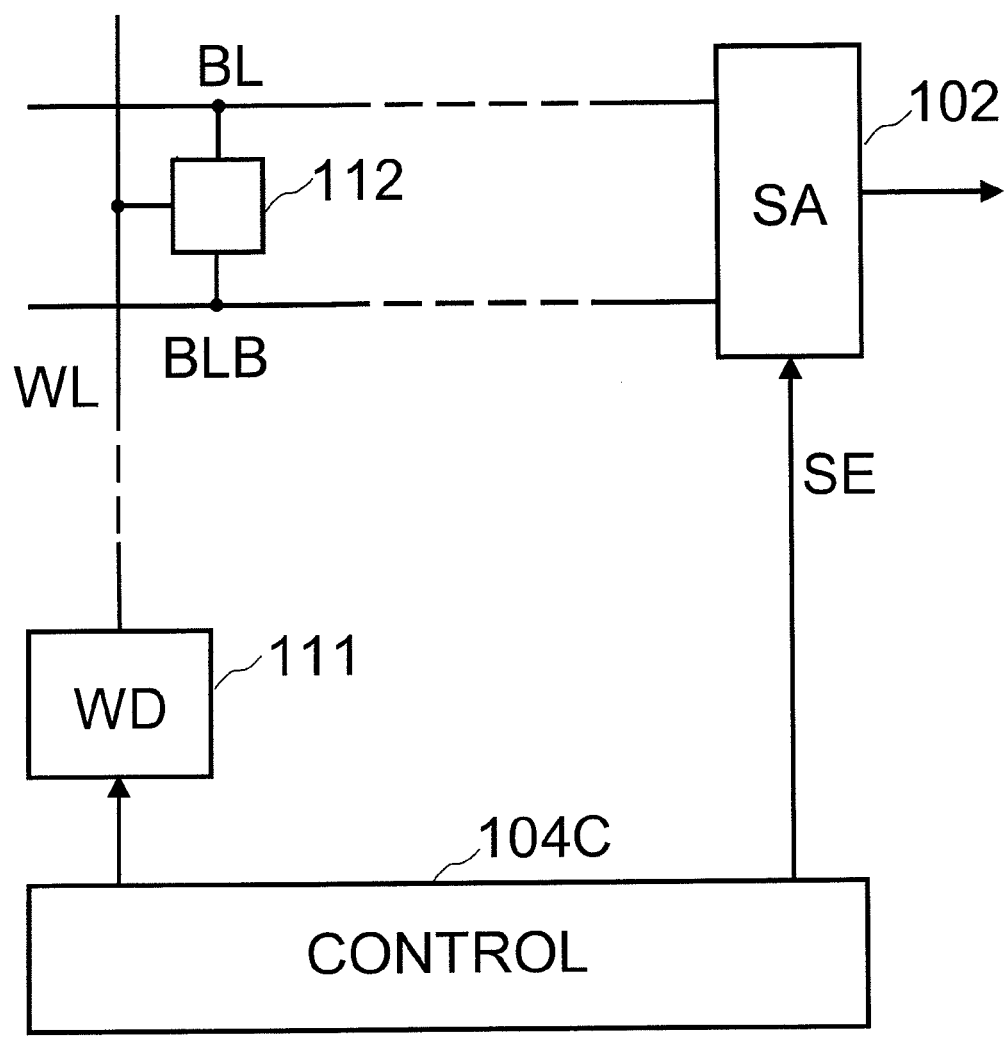
FIG. 22 is a circuit block diagram of a readout/write circuit of an information storage device according to Example 14.

FIG. 22 depicts a circuit diagram showing a readout/write control circuit for an information storage device of Example 14. The test method of Examples 11 and 12 may readily be implemented by having the readout/write control circuit of FIG. 22 enclosed in the information storage device. Since the readout/write control circuit of FIG. 22 is a modification of the readout/write control circuit of FIG. 21, the description of those parts which are the same as those of the readout control circuit of FIG. 21 is dispensed with and only those parts differing from the readout control circuit of FIG. 21 are explained. In the readout/write control circuit of FIG. 22, a control circuit 104c may for itself adjust the timing as appropriate to drive the word line driver 111 and the sense amplifier 102. The foregoing is the explanation of the readout operation, For a write operation, it is sufficient that the control circuit 104C possesses the function of selecting the time Tw as from rise until fall of the word line potential from two or more different values. However, the write operation differs from the readout operation in that the potential on the bit line pair BL and BLB is provided from the peripheral circuit via the sense amplifier 102.

Example 15

Figure 23:
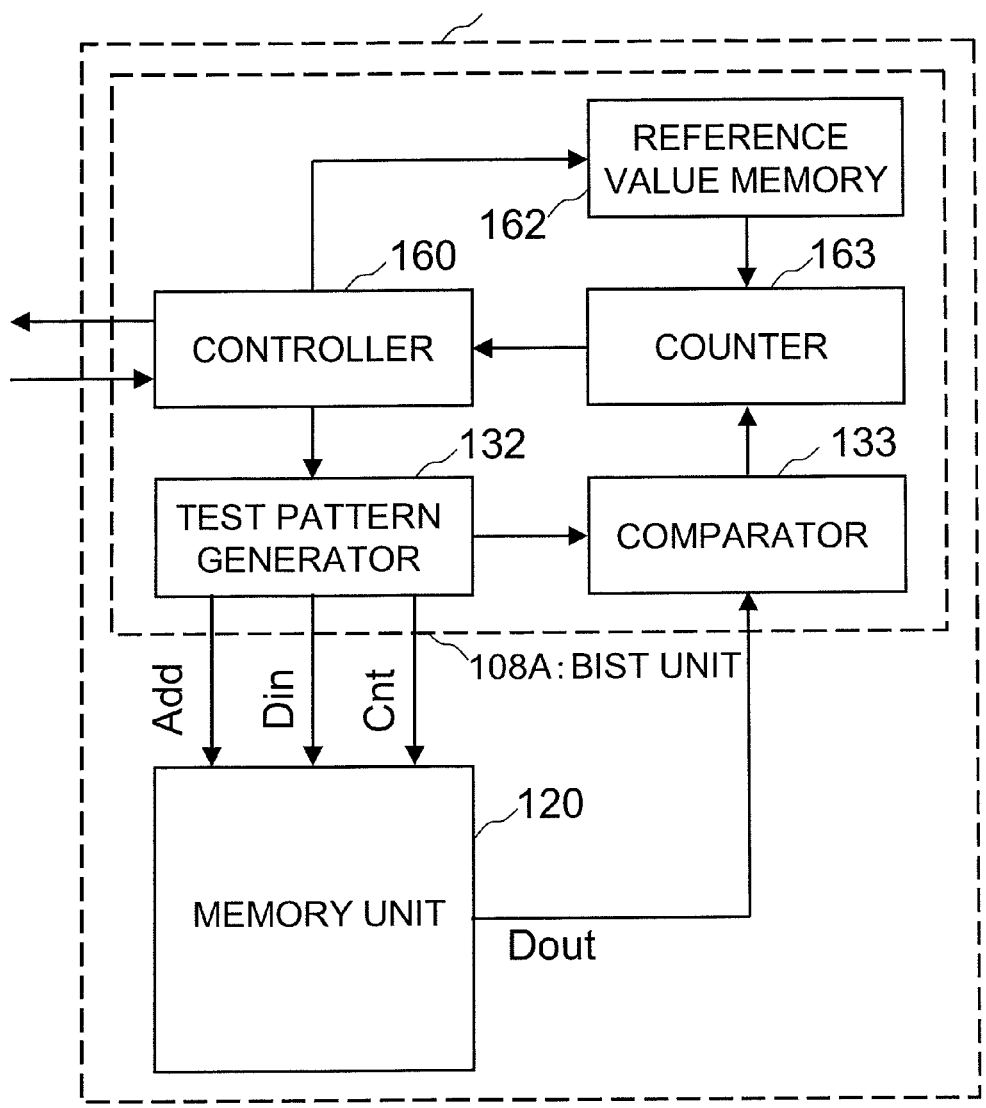
FIG. 23 is a block diagram of the vicinity of a BIST unit of an information storage device according to Example 15.

In the Example 7, the information storage device 100A provided with the built-in BIST function of carrying out the test of Example 1 to 4 has already been described with reference to FIG. 14. Example 15 is another Example of the information storage device having the built-in BIST function. FIG. 23 depicts a block diagram of the vicinity of the BIST unit in the information storage device of Example 15. A memory enclosing chip 400, an information storage device, includes a memory unit 120 and a BIST unit 108A that executes a self-test of the memory part. The BIST unit 108A also includes a controller 160 controlling the operation of the BIST in its entirety, a test pattern generator 132 that executes BIST of the memory unit 120, and a comparator 133. The BIST unit 108A further includes a counter 163 and a reference value memory 162.

The test pattern generator 132 sequentially provides an address Add and input data Din to the memory unit 120 under test, while providing instructions for the write and readout operations by the control signal Cnt. The readout data Dout of the memory unit 120 is transmitted to the comparator 133. The comparator 133 verifies the coincidence of the readout data Dout with the pattern of expected values which is usually delivered from the test pattern generator. In case of non-coincidence, the faulty bit count value of the counter 163 is incremented by a number equal to the number of the faulty bits. The counter 163 compares the number of faulty bits stored therein to the reference number stored in the reference value memory 162 at all times and, in case the former exceeds the latter, notifies the controller 160 of the failure in the test. If, at the time of end of the test for all bits, there is no notice of failure in the test, the controller 160 gives a decision of success and, if otherwise, gives a decision for failure to output the result.

Figure 24:
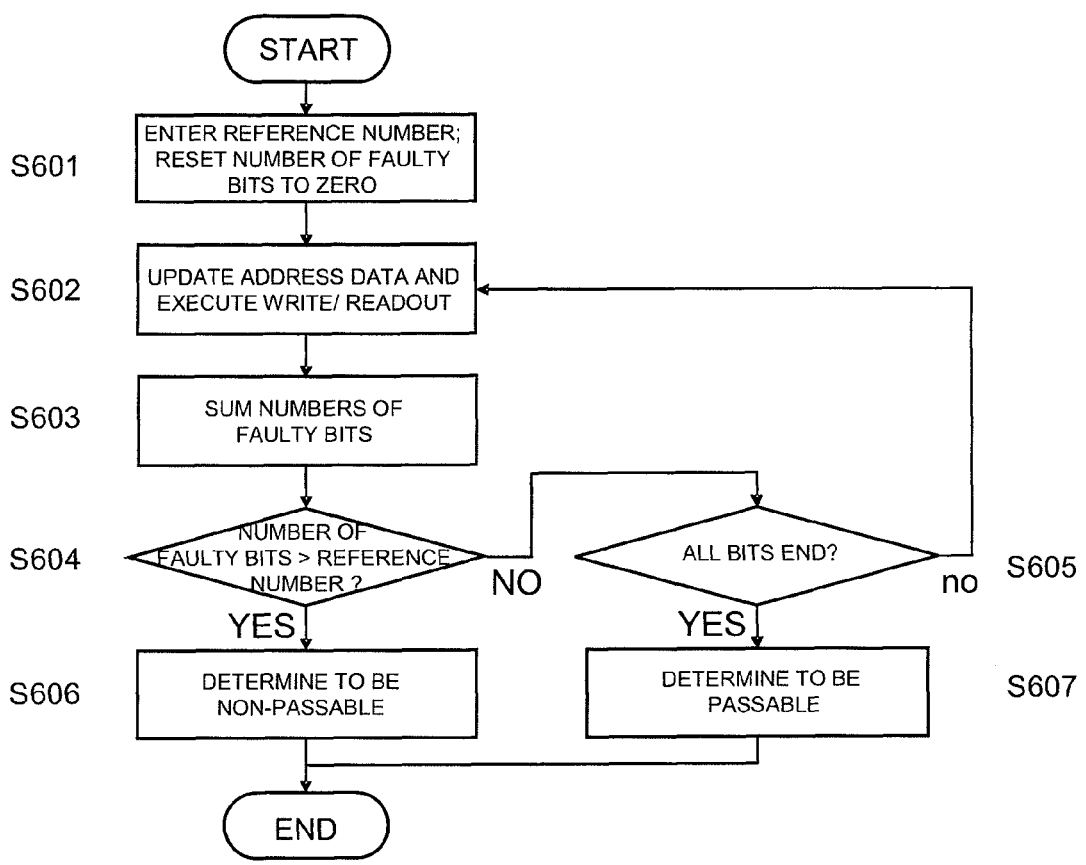
FIG. 24 is a flowchart for a test method according to Example 15.

FIG. 24 depicts a flowchart for the test method of Example 15. Referring to FIG. 24, the operation for the test of the memory unit 120 of the memory enclosing chip 400, an information storage device, will now be described. In starting the testing for the memory unit 120, a reference number is entered to the reference value memory 162, by way of an initializing operation, and the count value of the faulty bits of the counter 163 is set to zero (step S601).

Then, data write in and data read out from the memory unit 120 is carried out as the data and the address to be transmitted to the memory unit 120 are renewed based on a test pattern output from the test pattern generator 132 (step S602). If, as a result of reading out data from the memory unit 120, the expected value output from the test pattern generator 132 is different from the data Dout read out from the memory unit 120, it is determined that there exists a faulty bit. The counter 162 then sums the count values of the faulty bits (step S603).

It is then checked whether or not the total number of faulty bits as summed together exceeds the reference number stored in the reference value memory 162 (step S604). If the total number of bits of the counter 163 exceeds the reference number of the reference value memory 162 (YES of the step S604), the chip under test is determined not to pass the test to terminate the testing (step S606).

If the number of the faulty bits in the counter 163 is not in excess of the reference number of the reference value memory 162 (NO of the step S604), processing reverts to the step S602 to continue the processing until the testing of the total of the bits of the memory unit 120 comes to a lose (NO of the step S605). If the testing of the total of the bits has come to a close (YES of the step S605), a decision is given that the chip of interest has passed the test. The processing is then finished (step S607).

In the Example 15, it is possible to provide the BIST unit 108A with a test circuit that severely adjusts the access timing to the memory bits explained in connection with the Examples 13 and 14. It is also possible to provide a power supply conversion circuit 203 that controls the voltage applied to the main part of the storage device 201 of Example 9 explained using FIG. 17. The BIST unit 108A may be provided with the function of controlling the output voltage. It is further possible to provide a temperature control circuit 303 that controls the temperature of the main part of the storage device 301 of Example 10 explained with reference to FIG. 18. The BIST unit 108A may be provided with the function of controlling the temperature control circuit 303.

The test method, information storage device and the memory tester according to the present invention may also be applied to the information storage devices having the function of rescuing faulty bits by redundant bits. However, in counting the bits that failed in operation, it is preferred to count the failed bits in a state where the rescue by redundant bits is not enabled. The reason is that, while a sufficiently large number of faulty bits are desirably generated to determine the operational margin of the information storage device to high accuracy, the measurement condition where larger numbers of faulty bits are generated may be implemented more readily for the state where the rescue by redundant bits is not enabled.

The rescue by redundant bits may be exemplified by a method of dynamically relieving the malfunction using ECC (Error Correction Code) and a method of fixedly replacing the faulty bits by redundant bits at the time of shipment. If the former method is used, there may be obtained an advantage that the malfunction due to noise of the information storage device may be reduced so that the operational margin may be reduced in comparison with the case where there are no redundant bits. Thus, in case the present invention is applied, the reference number may be enlarged as compared to the case where no redundant bits are used, if other conditions are the same. Thus, there are cases where the condition of decision is varied by exploiting the redundancy. However, the concept of the present invention that the size of the operational margin is determined by counting the number of faulty bits may apply without dependency upon the presence or absence of the mechanism of redundancy.

Various modes are possible in the present invention, as described above. However, the following modes are also possible. These are given below for assurance sake.

[Mode 1] The test method for an information storage device of the present invention, wherein the test condition is selected so that an operational margin of the memory bits is selected to be further smaller than the worst condition among the conditions that may be presupposed in real use of the device.

[Mode 2] The test method for an information storage device of the present invention, wherein the test may be conducted as the test condition is set so that the probability of occurrences of failures in the operation of the memory bits in the information storage device will be further higher than if the worst condition in the condition presupposed in real use of the information storage device is used.

[Mode 3] A computer program that controls a memory tester used for testing an information storage device, in which the program preferably comprises a step of having the memory tester conduct a test on an information storage device as a test condition is set so as to be outside a range of conditions that may be presupposed in real use of the information storage device, and having the memory tester count the number of faulty bits, and a step of having the memory tester compare the count value to a preset reference value not smaller than 1 and having the memory tester give a decision for not passable and passable depending on whether the count value exceeds or is less than the reference value.

[Mode 4] Such a program is desirable in which, if the test conducted under the above mentioned test condition is a first test, the program has the memory tester conduct a second test on the information storage device as the test condition is set within a range of conditions that may be presupposed in real use of the information storage device. The second test is also such a test in which the information storage device is determined to be not passable and passable depending on whether there is or there is not any memory bit that fails in operation, respectively. The program also desirably allows the memory tester to give a decision on whether the information storage device is a good product or a reject depending on the results of the first and second tests.

[Mode 5] A test method for an information storage device comprising:

a step of setting a test condition, including at least one of a power supply voltage and the temperature, so as to be outside a range of conditions presupposed in real use of said information storage device; and carrying out a test on said information storage device to count the number of memory bits thereof that fail in operation; and a step of comparing a count value obtained to a preset reference value not less than 1, giving a decision for passable if the count value exceeds said reference value and; giving a decision for not passable if the count value is equal to or less than said reference value.

[Mode 6] A test method for an information storage device having larger numbers of memory bits; said method including a step of testing said information storage device under a first test condition to count the number of said memory bits that fail in operation as a first number of faulty bits;

a step of testing said information storage device under a second test condition different from said first test condition to count the number of said memory bits that fail in operation as a second number of faulty bits; and a step of determining the size of random variations of said memory bits of said information storage device from said first number of faulty bits and from said second number of faulty bits.

The present invention may be exploited for testing an information storage device, in particular an information storage device the memory cells of which suffer from random variations. The present invention may further be applied to semiconductor elements other than an information storage device provided that the semiconductor elements has larger numbers of miniscule size cells of the same formulation.

It should be noted that other objects, features and aspects of the present invention will become apparent in the entire disclosure and that modifications may be done without departing the gist and scope of the present invention as disclosed herein and claimed as appended herewith.

Also it should be noted that any combination or selection of the disclosed and/or claimed elements, matters and/or items may fall under the modifications aforementioned.

What is claimed is:

1. A method of testing an information storage device including a plurality of memory bits, the method comprising:
   performing a first test on said information storage device by setting a first test condition outside of a presupposed range of real use conditions, and counting a number of faulty bits which are those of said memory bits that fail in operation; and
   determining a size of an operational margin of said information storage device from the number of said faulty bits, wherein
   said first test condition outside said presupposed range of real use conditions is selected such that, when the information storage device that does not fail under a condition inside said presupposed range of real use conditions is tested, an expected number of faulty bits is at least one thousand.

2. The method of testing an information storage device according to claim 1, wherein
   said first test condition outside said presupposed range of real use conditions is selected by adjusting at least one out of a power supply voltage, a temperature and an access timing to said memory bits.

3. The method of testing an information storage device according to claim 1, further comprising:
   deciding that said information storage device fails the first test in response to the number of said faulty bits being larger than a reference value which is equal to one thousand or more; and
   deciding that said information storage device passes the first test in response to the number of faulty bits not being larger than said reference value.

4. The method of testing an information storage device according to claim 1, wherein said first test is conducted under a plurality of test conditions outside said presupposed range, the plurality of test conditions including the first test condition, the method further comprises:
   deciding that said information storage device fails the first test in response to the number of faulty bits being larger than said reference value in any of said plurality of test conditions; and
   deciding that said information storage device passes the first test in response to the number of faulty bits not being larger than said reference value in all of said plurality of test conditions.

5. The method of testing an information storage device according to claim 1, wherein said first test is conducted under a plurality of test conditions outside said presupposed range, the plurality of test conditions including the first test condition, the method further comprises:
   determining a magnitude of random variations based on the number of faulty bits in each of said plurality of test conditions.

6. The test method of an information storage device according to claim 1, wherein the first test condition is set by adjusting at least one of a power supply voltage and temperature, to be outside the presupposed range of real use conditions, the method further comprising:
   comparing said number of faulty bits to a preset reference value not less than one thousand;
   deciding, in response to the number of faulty bits exceeding the preset reference value, that said information storage device has failed the test; and
   deciding, in response to the number of faulty bits being less than or equal to the preset reference value, that said information storage device has passed the test.

7. The method of testing an information storage device according to claim 1, wherein
   said information storage device includes first and second circuits, which are supplied with a same power supply voltage under said real use conditions of said information storage device; and wherein
   under said first test condition, testing is conducted while different power supply voltages are supplied to said first and second circuits.

8. The method of testing an information storage device according to claim 1, further comprising:
   conducting a second test on said information storage device by setting a second test condition within the presupposed range of real use conditions, deciding, in response to the number of faulty bits being greater than or equal to one thousand, that said information storage device has failed the second test, and deciding, in response to the number of faulty bits being less than one thousand, that said information storage device has passed the second test; and
   deciding whether said information storage device is a good product or not based on a combination of the results of said first and second tests.

* * * * *